(12) United States Patent
Tsukada et al.

(10) Patent No.: US 7,312,401 B2
(45) Date of Patent: Dec. 25, 2007

(54) FLEXIBLE PRINTED WIRING BOARD

(75) Inventors: Kiyotaka Tsukada, Nagoya (JP); Terumasa Ninomaru, Gifu-Hashima (JP); Masaki Kizaki, Gifu-Hashima (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 11/229,672

(22) Filed: Sep. 20, 2005

(65) Prior Publication Data

US 2006/0068613 A1 Mar. 30, 2006

(30) Foreign Application Priority Data

Sep. 21, 2004 (JP) ............................ 2004-273669

(51) Int. Cl.
*H05K 1/00* (2006.01)
(52) U.S. Cl. .................. 174/254; 174/260; 174/262
(58) Field of Classification Search ................ 174/255, 174/260, 261, 262
See application file for complete search history.

(56) References Cited

U.S. PATENT DOCUMENTS

| | | | |
|---|---|---|---|
| 3,753,056 A * | 8/1973 | Cooke | 257/664 |
| 4,103,102 A * | 7/1978 | Klein | 174/254 |
| 5,997,983 A * | 12/1999 | Caron et al. | 428/105 |
| 6,472,609 B2* | 10/2002 | Wakako et al. | 174/255 |
| 6,555,755 B1* | 4/2003 | Yanagisawa | 174/254 |
| 6,559,377 B1* | 5/2003 | Noda et al. | 174/36 |
| 6,841,738 B2* | 1/2005 | Michiwaki et al. | 174/254 |
| 7,022,919 B2* | 4/2006 | Brist et al. | 174/260 |

FOREIGN PATENT DOCUMENTS

| | | |
|---|---|---|
| JP | 51-62054 U | 5/1976 |
| JP | H05-243741 | 9/1993 |
| JP | 06-45364 U | 6/1994 |
| JP | H06-216537 | 8/1994 |
| JP | H07-202358 | 8/1995 |
| JP | H08-125342 | 5/1996 |
| JP | H08-130351 | 5/1996 |
| JP | 10-079559 A | 3/1998 |
| JP | 2000-077796 A | 3/2000 |
| JP | 2002-171071 A | 6/2002 |
| JP | 2004-186235 A | 7/2004 |

OTHER PUBLICATIONS

International Search Report in PCT International Application PCT/JP2005/017374.
International Preliminary Report on Patentability in PCT International Application PCT/JP2005/017374.
Written Report of International Searching Authority in PCT International Application PCT/JP2005/017374.
WIPO Initial Publication of PCT International Application PCT/JP2005/017374.

* cited by examiner

*Primary Examiner*—Ishwar (I. B.) Patel
(74) *Attorney, Agent, or Firm*—Oblon, Spivak, McClelland, Maier & Neustadt, P.C.

(57) ABSTRACT

A flexible printed wiring board includes a first conductor layer in the element mounting part adjacent to the top surface of the wiring board; a second conductor layer in the element mounting part adjacent to the bottom surface of the wiring board; and a third conductor layer between the first conductor layer and the second conductor layer, wherein the first and third conductor layers extend through and beyond the bending part, and the second conductor layer is absent in the bending part.

10 Claims, 15 Drawing Sheets

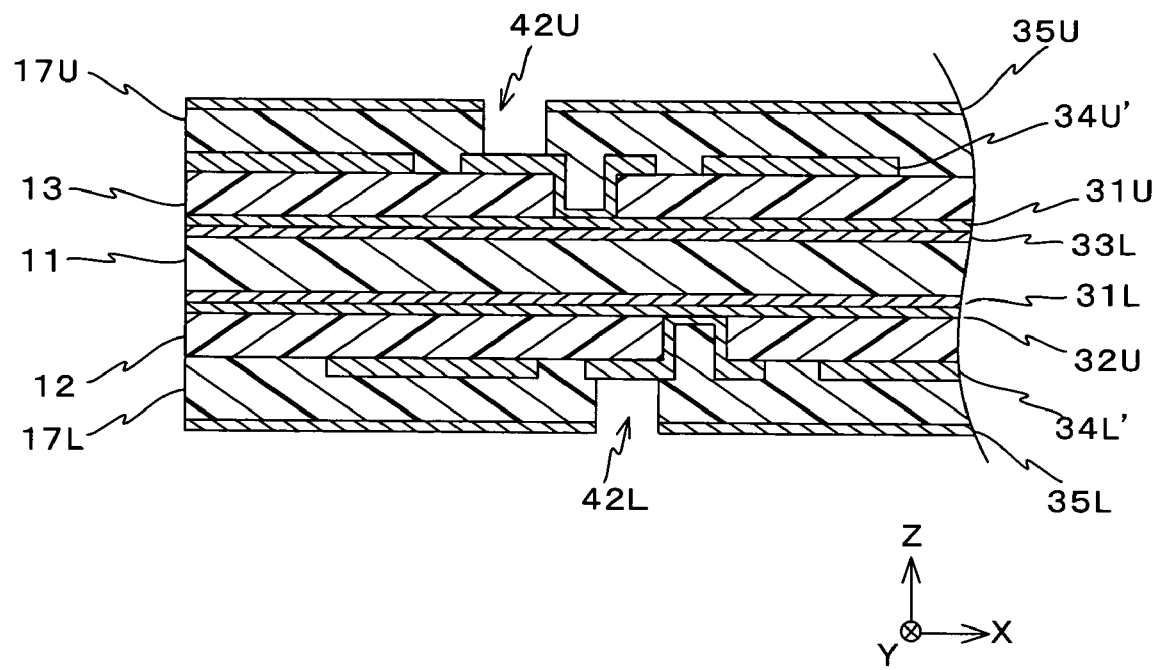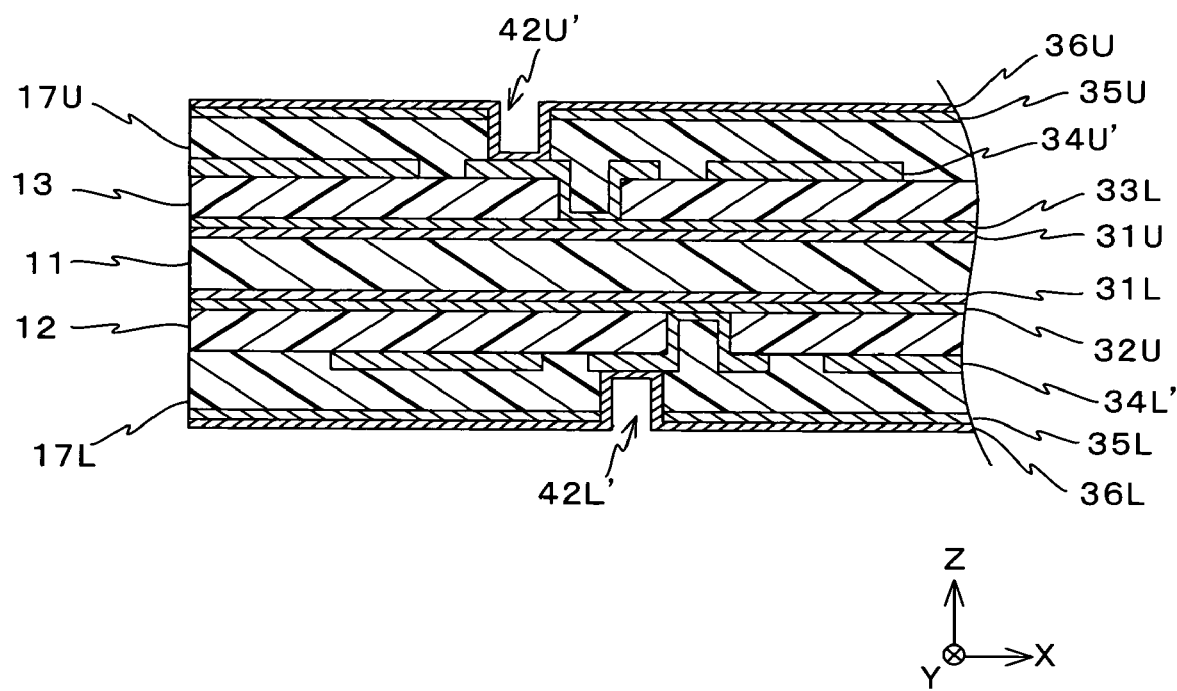

FIG. 10
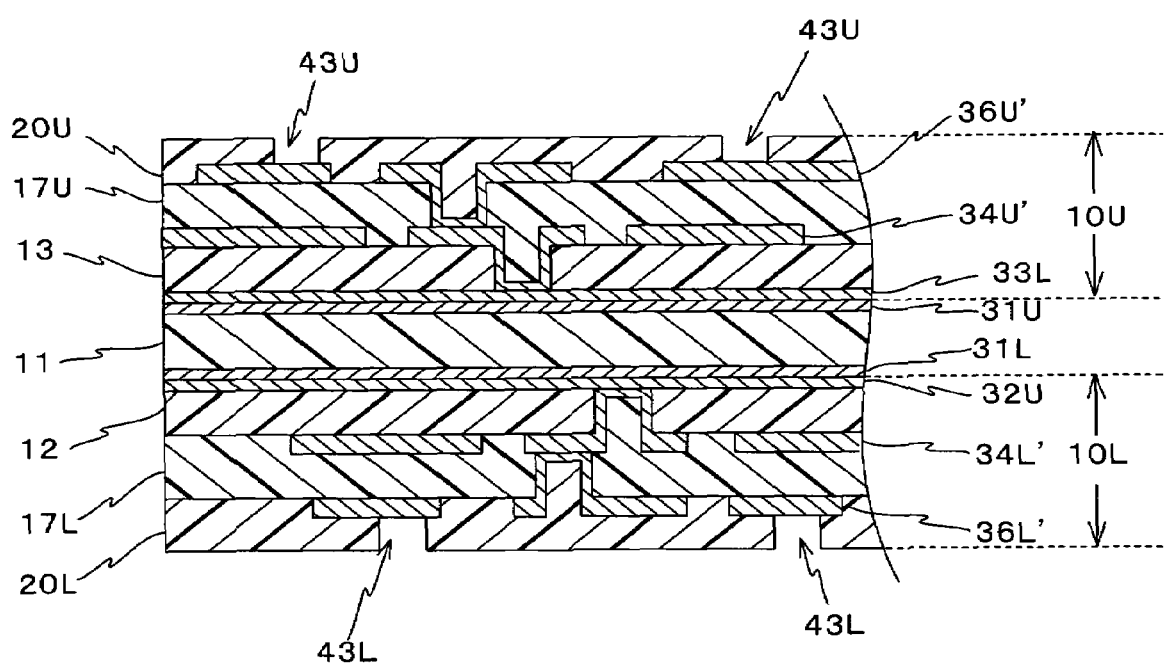
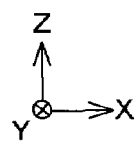

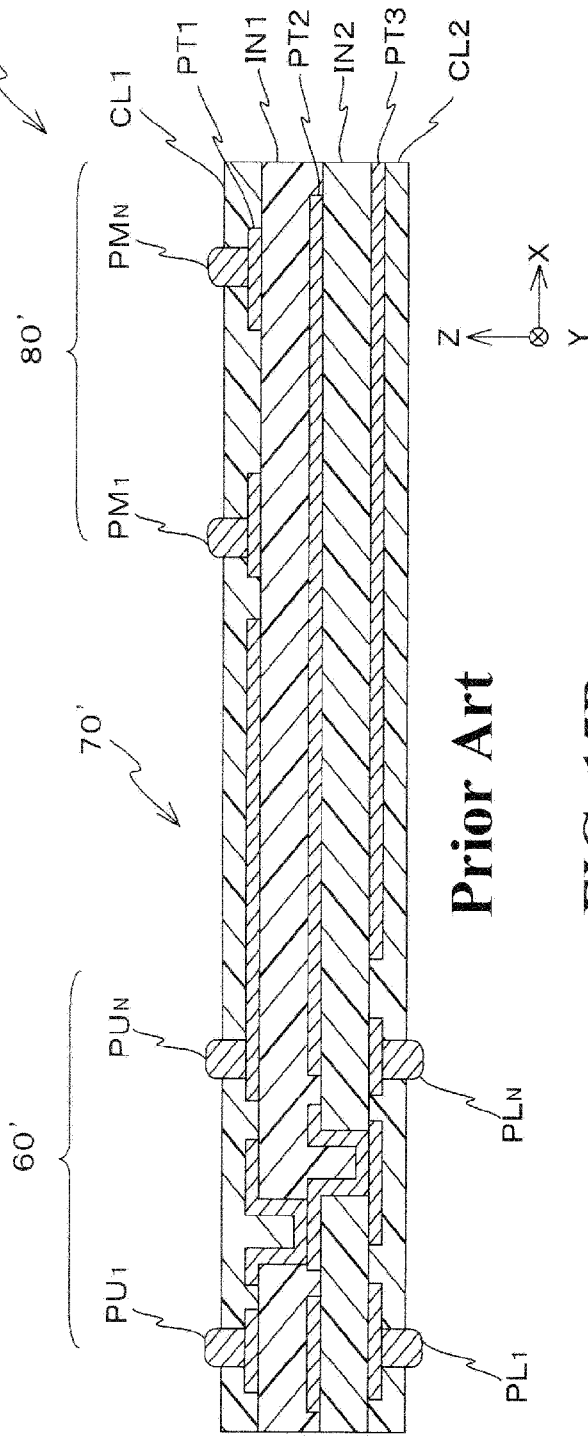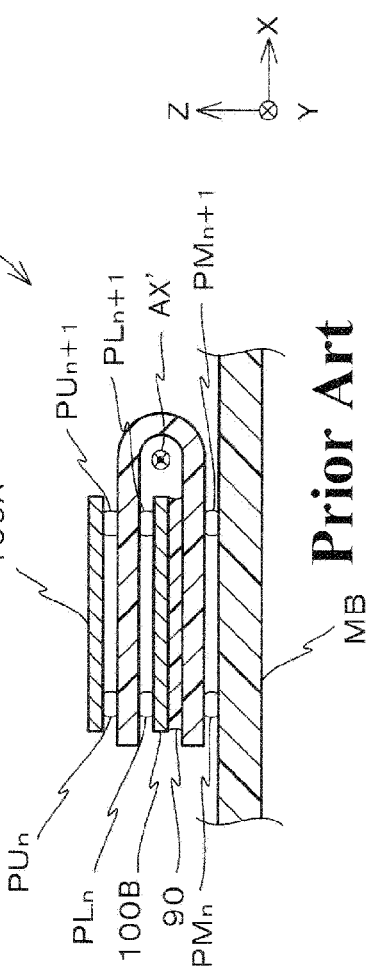

FLEXIBLE PRINTED WIRING BOARD

This application claims the benefit of Japanese Application No. 2004-273669, filed on Sep. 21, 2004 in Japan, which is hereby incorporated by reference in its entirety.

BACKGROUND OF THE INVENTION

1. Field of the Invention

This invention relates to a flexible printed wiring board, and more particularly, to a flexible printed wiring board having an element mounting part where circuit elements are mounted and a bending part to be bent around a bending axis.

2. Discussion of the Related Art

Recent progress in information society invites rapid increase in information quantity, and rapid exchange and transmission of a large capacity of information data are required. Consequently, integration in electronic circuit elements has been improved, and enhancement in performance, enhancement in function and enhancement in integration are in progress for electronic information apparatus. In such a trend, printed wiring boards used in electronic information apparatus are also undergoing enhancement in thinning, miniaturization, and intensified function, and various proposals have been made for flexible printed wiring boards as well. See Patent Document Nos. 1-5, listed below, for example.

Patent Document No.1: Japanese Patent Laid-Open No. 1993-243741

Patent Document No.2: Japanese Patent Laid-Open No. 1994-216537

Patent Document No.3: Japanese Patent Laid-Open No. 1996-130351

Patent Document No.4: Japanese Patent Laid-Open No. 1996-125342

Patent Document No.5: Japanese Patent Laid-Open No. 1995-202358

Among such flexible printed wiring boards, with respect to those with memory elements mounted thereon, a new structure with an increased memory capacity and speed has been proposed and put into practical use. For example, flexible printed wiring boards in which a chip size package (CSP) is mountable to both surfaces have been developed.

Such a flexible printed wiring board with CSPs mounted on both surfaces is arranged to have a layered structure throughout the substrate surface, as shown in FIGS. 15A and 15B, typically consisting of three conductor layers (PT1 to PT3), two insulating layers (IN1 and IN2) isolating these conductor layers, and two coverlay layers (CL1 and CL2) (hereafter referred to as "related art example"). In addition, in a flexible printed wiring board of the related art example, memory elements, for example, are mounted on both surfaces of an element mounting part 60' as shown in FIG. 15A. A bending part 70' is bent around the bending axis AX', so that a motherboard connecting part 80', which is formed at the top surface on the other end, is made in electric contact with the motherboard MB (FIG. 15B). Consequently, the efficiency in implementation of memory elements on a motherboard can be improved.

When the above described related art example of a flexible printed wiring board is bent along the bending axis, tensile stress is applied to the outer side, while compressive stress is applied to the inner side. In addition, depending on the curvature at the time of bending, cracks may occur in the insulating layers. Therefore, it is preferable to decrease the curvature of bending; but the decrease in the curvature of bending would impede high-density mounting of memory elements.

Therefore, currently, a flexible printed wiring board with improved bending-withstanding properties is desired.

SUMMARY OF THE INVENTION

Accordingly, the present invention is directed to a flexible printed wiring board and a method of manufacturing the same that substantially obviate one or more of the problems due to limitations and disadvantages of the related art.

An object of the present invention is to provide a flexible printed wiring board that has improved crack resistance.

Another object of the present invention is to provide a flexible printed wiring board that has an improved electronic continuity property.

Another object of the present invention is to provide a coreless thin-type flexible wiring board that has superior crack resistance and electronic continuity properties.

Another object of the present invention is to provide a flexible printed wiring board that has an improved characteristic impedance.

Another object of the present invention is to provide an efficient and high-yield manufacturing method for the flexible printed wiring board of the present invention.

Another object of the present invention is to provide a both-surface mountable flexible wiring board that enables high-density low-profile mounting of circuit elements on a host board.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, according to one aspect of the invention, there is provided a flexible printed wiring board having an element mounting part configured to mount circuit elements on both top and bottom surfaces thereof and a bending part that is to be bent around a bending axis that extends substantially in parallel with the wiring board, the top surface of the wiring board being defined as a surface that comes to the outermost side when the bending part is bent around the bending axis, the bottom surface of the wiring board being defined as a surface that comes to the innermost side when the bending part is bent around the bending axis, the flexible printed wiring board including a first conductor layer in the element mounting part adjacent to the top surface of the wiring board; a second conductor layer in the element mounting part adjacent to the bottom surface of the wiring board; and a third conductor layer between the first conductor layer and the second conductor layer, wherein the first and third conductor layers extend through and beyond the bending part, and the second conductor layer is absent in the bending part.

In another aspect, the present invention provides a flexible printed wiring board having three parts of an element mounting part, a folding part, and a board mounting part, which are laterally disposed in that order, the element mounting part being configured to mount circuit elements on both top and bottom surfaces of the wiring board, the board mounting part being configured such that the top surface of the board mounting part can be mounted on an external circuit board, the flexible printed wiring board being configured to be folded over at the folding part around a virtual folding line that extends substantially in parallel with the wiring board such that the top surface of the wiring board faces an exterior when the flexible printed wiring board is bent, the flexible printed wiring board including: a bottom conductor pattern in the element mounting part, the bottom conductor pattern being configured to mount a first circuit element on the bottom surface of the wiring board through a first plurality of pads that are directly in contact with the bottom conductor pattern, the bottom conductor pattern being absent in the folding part; a lower insulating layer on the bottom conductor pattern in all of said three parts, the lower insulating layer having a first plurality of via holes in the element mounting part; a middle conductor pattern on the lower insulating layer in all of said three parts, portions of the middle conductor pattern being electrically in contact with portions of the bottom conductor pattern via said first plurality of via holes; an upper insulating layer on the middle conductor pattern in all of said three parts, the upper insulating layer having a second plurality of via holes in the element mounting part; and a top conductor pattern on the upper insulating layer in all of said three parts, the top conductor pattern in the element mounting part being configured to mount a second circuit element on the top surface of the wiring board through a second plurality of pads that are directly in contact with the top conductor pattern, the top conductor pattern in the board mounting part being configured to mount the flexible printed wiring board to an external circuit board through a plurality of pads that are directly in contact with the top conductor pattern, portions of the top conductor pattern being electrically in contact with portions of the middle conductor pattern via said second plurality of via holes.

In another aspect, the present invention provides a flexible wiring board for mounting circuit elements on both surfaces on one end, the other end of the flexible wiring board being configured to be folded over against said one end and configured to be mounted on an external host board to enable high-density low profile mounting of the circuit elements on the external host board, the flexible wiring board having a three-layered conductor structure on said one end so that the circuit elements can be mounted on both surfaces and having a two-layered conductor structure in a fold-over portion at which the flexible wiring board is to be folded over, the two layered conductor structure being configured to provide for improved crack resistance at the fold-over portion.

In another aspect, the present invention provides a method for manufacturing a flexible printed wiring board having an element mounting part configured to mount circuit elements on both top and bottom surfaces thereof and a bending part that is to be bent around a bending axis that extends substantially in parallel with the wiring board, the top surface of the wiring board being defined as a surface that comes to the outermost side when the bending part is bent around the bending axis, the bottom surface of the wiring board being defined as a surface that comes to the innermost side when the bending part is bent around the bending axis, the method including the steps of: forming a first conductor layer in the element mounting part adjacent to the top surface of the wiring board; forming a second conductor layer in the element mounting part adjacent to the bottom surface of the wiring board; and forming a third conductor layer between the first conductor layer and the second conductor layer, wherein the first and third conductor layers extend through and beyond the bending part, and the second conductor layer is absent in the bending part.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 1A is a schematic perspective view. FIG. 1B is a side view.

FIGS. 8A and 8B are cross-sectional views illustrating manufacturing steps of a flexible printed wiring board according to an embodiment of the present invention.

FIG. 10 is a cross-sectional view illustrating the manufacture of a flexible printed wiring board according to an embodiment of the present invention.

FIGS. 15A and 15B illustrate a construction of a flexible printed wiring board according to the related art. FIG. 15A is a schematic perspective view. FIG. 1B is a side view.

DETAILED DESCRIPTION OF THE PREFERRED EMBODIMENTS

Figure 1A:
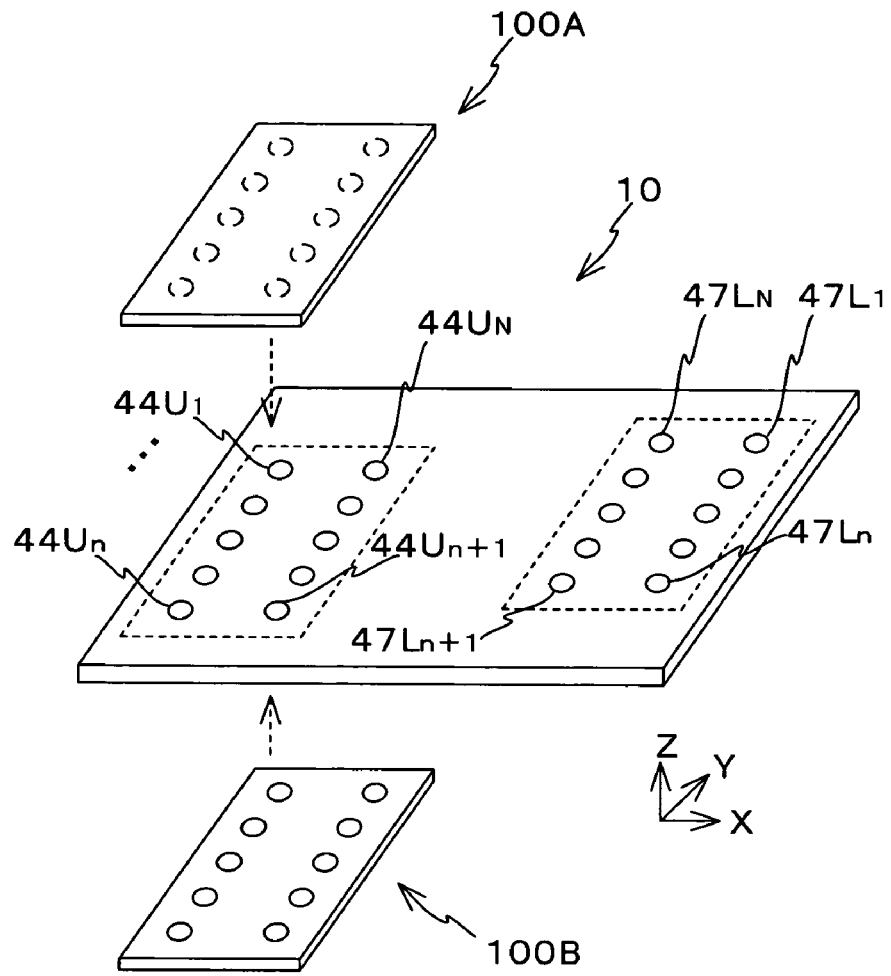
FIGS. 1A and 1B illustrate a construction of a flexible printed wiring board according to one embodiment of the present invention.

A flexible printed wiring board according to a preferred embodiment of the present invention includes an element mounting part where circuit elements are mounted and a bending part to be bent around the bending axis. An inner conductor layer is formed on the inside of the board. In the element mounting part, element mounting part conductor layers are formed on both surfaces at outer sides of the wiring board, respectively, and in the bending part, a bending part conductor layer is formed only on the surface on the outer side that faces the exterior when the wiring board is bent.

Here, in the above described element mounting part, the element mounting part conductor layers are formed on both surfaces at the outer sides of the wiring board, respectively. In contrast, in the bending part, the bending part conductor layer is formed only on the side that faces the exterior when it is bent. Therefore, as compared with the related art example described above, this configuration allows a reduction of the number of conductor layers in the bending part by one and the number of coverlay layer by one as well. Thus, by reducing the number of layers in the bending part, the total thickness can be made thin as compared with the related art flexible printed wiring boards. Consequently, when the flexible wiring board is bent at the same curvature, the stress is reduced, and therefore crack resistance is improved.

In addition, in the above described inner layer conductor layer, a conductor pattern that imparts a ground potential in terms of alternating current may be formed. Thus, by forming a conductor pattern to impart a ground potential in terms of alternating current as an interior layer conductor layer, the characteristic impedance of a signal circuit pattern (also referred to as "outer layer conductor pattern") formed at the side that faces the exterior can be stabilized even when the flexible printed wiring board is bent along the bending axis.

In particular, in the inner conductor layer in the bending part, a conductor pattern to impart the ground potential in terms of alternating current may be formed in a plane pattern. In this case, signal lines of the outer layer conductor pattern in the bending part can be formed to constitute a microstrip configuration, thereby further stabilizing the characteristic impedance.

The insulating layer formed between the above described conductor patterns is preferably made of fiber-reinforced plastic. Such fiber-reinforced plastic can include, for example, fiber-glass reinforced plastic (GFRP), carbon fiber reinforced plastic (CFRP) and the like. More specifically, glass-fiber-reinforced epoxy, glass-fiber-reinforced polyester resin and the like may be used.

The thickness of the above described insulating layer is preferably about 25 μm to about 65 μm. Here, when the thickness of the above described insulating layer is less than about 25 μm, it is difficult to form an insulating layer with a uniform thickness, while when the thickness exceeds about 65 μm, preferable crack resistance may not be obtained.

In addition, the warp and the weft contained in the above described fiber-reinforced plastic preferably extend in the directions intersecting the direction of the above described bending axis by an angle of about 30° or more and about 60° or less. With this configuration, when the wiring board is bent, the warp and the weft mechanically cooperate to improve crack resistance.

The signal conductor pattern formed in the above described bending part conductor layer preferably extends in the direction that is obliquely disposed relative to the direction of the above described bending axis. This way, when the bending part is bent around the bending axis, the crack-prevention performance of the signal conductor pattern is further improved and the occurrence of cracks can be further reduced.

Incidentally, the above described circuit element can be a memory element. In this case, high density implementation of memory elements, which has been desired more and more in recent years, becomes possible.

One advantage of the present invention is that a flexible printed wiring board with improved crack resistance can be provided.

Figure 1B:
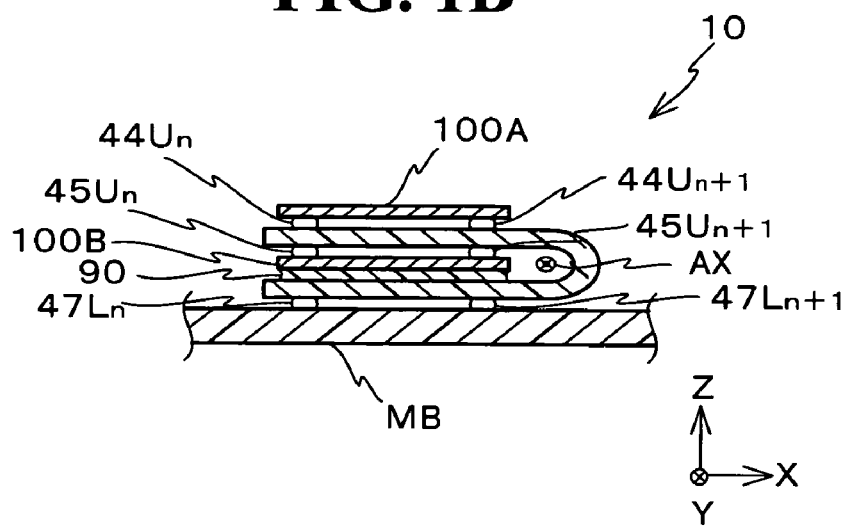

FIGS. 1A and 1B shows a configuration of a flexible printed wiring board 10 according to an embodiment of the present invention. FIG. 1A is a perspective view thereof FIG. 1B is an XZ side view of the flexible printed wiring board 10 which is bent at a bending part along the bending axis AX and is attached to a motherboard MB.

In this embodiment, on the upper surface (i.e., the surface facing in the +Z direction) of the flexible printed wiring board 10 shown in FIG. 1A, pads $44U_1$ to $44U_N$ for mounting a circuit element 100A and pads $47L_1$ to $47L_N$ are provided, and pads $44Up_1$ to $44Up_N$ and pads $47L_1$ to $47L_N$ are electrically connected, respectively, for example.

In addition, although not shown in FIG. 1A, on the lower surface (i.e., the surface facing in the −Z direction) of the flexible printed wiring board 10, pads $45U_1$ to $45U_N$ for mounting a circuit element 100B are formed at locations that correspond to the pads $44U_1$ to $44U_N$. For example, these pads $45U_1$ to $45U_N$ and pads $47L_1$ to $47L_N$ are also electrically connected, respectively.

Here, in the present embodiment, both circuit element 100A and circuit element 100B can be memory elements of the same type.

The flexible printed wiring board 10 of the present embodiment is employed as follows. As shown in FIG. 1, the element 100A is mounted on the upper surface and the element 100B is mounted on the lower surface of the flexible printed wiring board 10. In mounting the flexible printed wiring board 10 on a host board, such as a mother board, the flexible printed wiring board 10 is bent around the bending axis AX, and is mounted on the motherboard MB, as shown in FIG. 1B. In this case, the circuit element 100B of the flexible printed wiring board 10 is bonded via a bonding layer 90 to a surface of the folded-over portion of the flexible printed wiring board, which is opposite to the surface having the pads $47L_1$ to $47L_N$.

Figure 2:
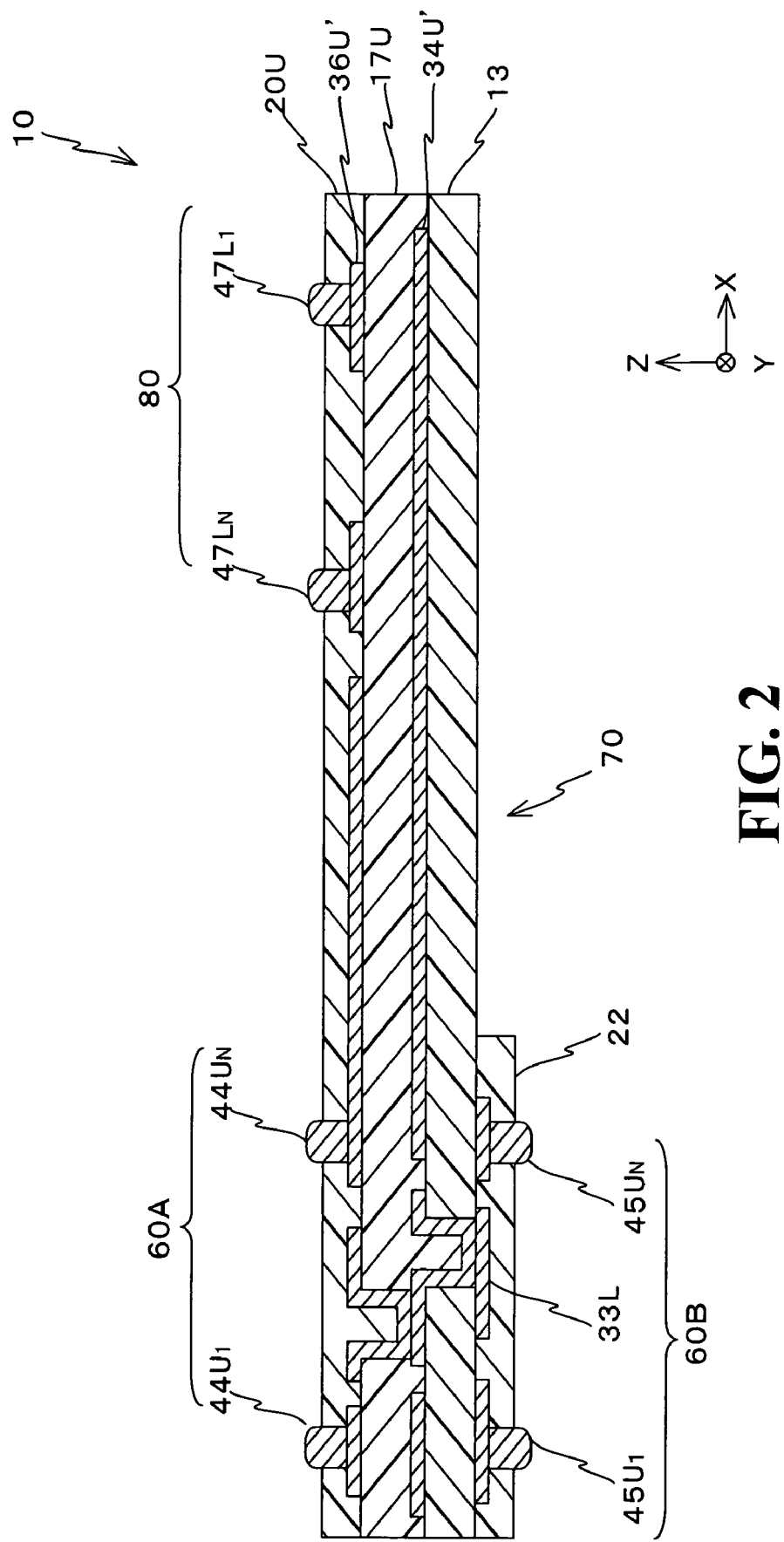
FIG. 2 is a cross-sectional view of a flexible printed wiring board according to an embodiment of present invention.

FIG. 2 shows an XZ cross-sectional view of the flexible printed wiring board 10 of the present embodiment. As shown in FIG. 2, the flexible printed wiring board 10 of the present embodiment includes an element mounting parts 60A and 60B (also referred to as "element mounting part 60" collectively) where the circuit elements 100A and 100B as described above are to be mounted, a bending part 70 where this flexible printed wiring board is bent around the bending axis AX, and a motherboard connecting part 80, which is to be connected to a motherboard.

In addition, the flexible printed wiring board 10 includes, in the element mounting part 60, (a) an insulating layer 13, (b) an insulating layer 17U formed on a surface in the +Z direction side of the insulating layer 13, (c) an insulating layer 20U, which is the outmost layer formed on a surface in the +Z direction side of the insulating layer 17U and (d) an insulating layer 22 formed on a surface in the −Z direction side of the insulating layer 13. Here, the insulating layers 20U and 22 respectively function as coverlay layers. Since the insulating layer 22 is not formed in the bending part 70, the bending part 70 includes the layers (a) to (c), but does not include the insulating layer 22 (d).

In addition, the flexible printed wiring board 10 includes (e) a conductor pattern 34U' formed on the surface in the +Z direction of the insulating layer 13, (f) a first conductor pattern 36U', which is a signal line pattern, formed on the surface in the +Z direction of the insulating layer 17U and (g) a second conductor pattern 33L, which is a signal line pattern, formed on the surface in the −Z direction of the insulating layer 13 in the element mounting part 60.

Here, this conductor pattern 34U' includes a conductor pattern to impart a ground potential in terms of alternating current (hereinafter also referred to as "ground pattern" or "GNP"), and additionally includes circuit patterns formed at via holes. The GNP may be formed in a solid pattern to cover substantially the entire area at the bending part 70.

Figure 3:
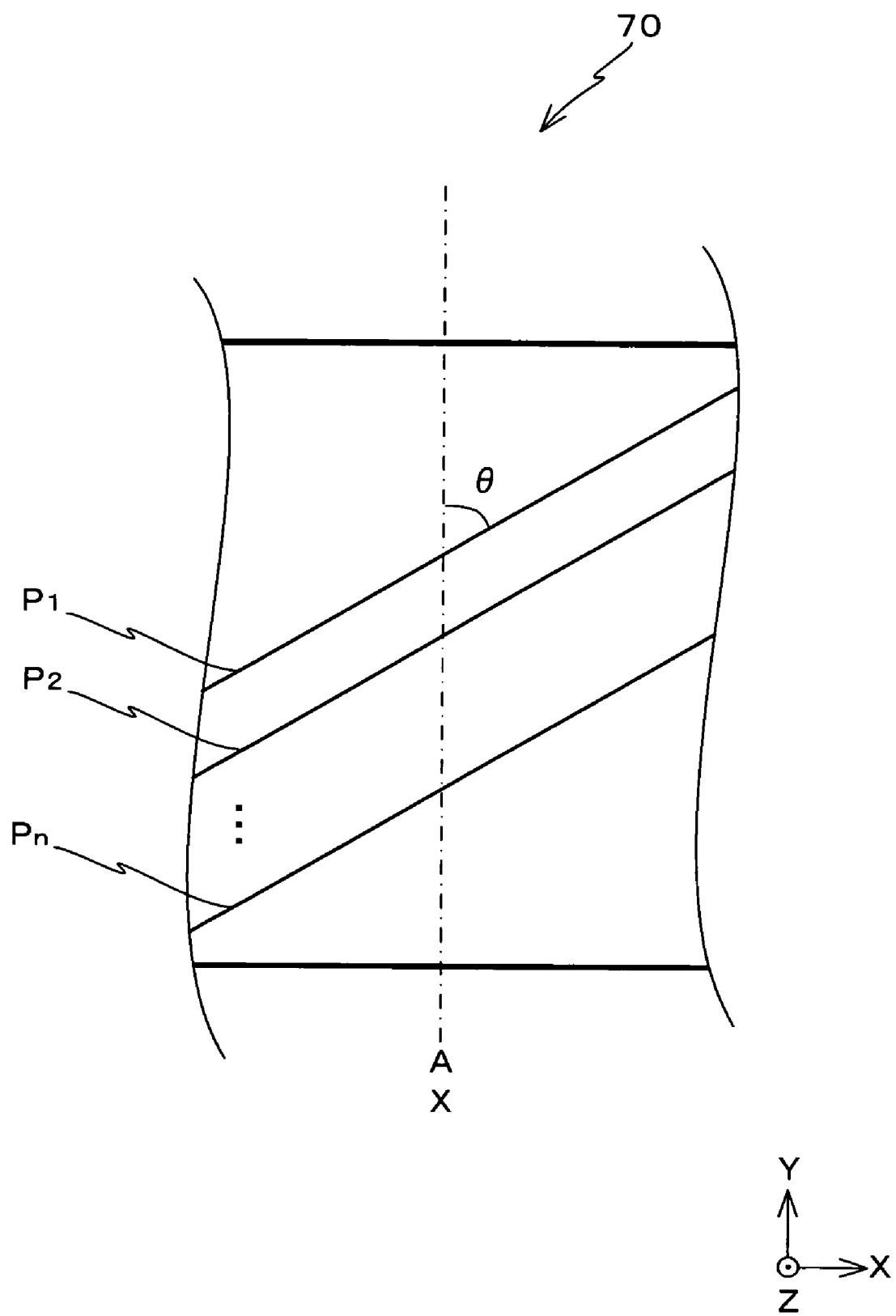
FIG. 3 is a schematic view illustrating the wiring direction of the signal conductor pattern of a flexible printed wiring board according to an embodiment of the present invention.

The first conductor pattern 36U' includes a power supply pattern as well. Here, in the bending part 70, the first conductor pattern 36U' is arranged to extend in the direction that intersects the bending axis AX (the Y direction) at an angle θ. In this embodiment, as shown in FIG. 3, conductor patterns $P_1$ to $P_N$ (which electrically connect the pads $44U_1$-$44U_N$ to $47L_1$-$47L_N$, respectively, for example) are not disposed parallel to the X direction, but intersect a virtual line extending in the Y direction at angle θ.

With the above-described configuration, because the ground potential pattern of the conductor pattern 34U' in the bending part 70 is formed to cover the substantially entire area, signal lines of the signal line pattern 36U' in the bending part 70 can be made very thin, thereby forming a microstrip configuration. In this case, the characteristic impedance can be stabilized.

Moreover, the flexible printed wiring board 10 includes (h) via holes in the insulating layers 13 and 17U, respectively, for providing interconnections among conductor pattern 36U' (including GNP), the first conductor pattern 36U', and the second conductor pattern 33L.

Here, although not depicted in FIG. 2, via holes are also provided in the motherboard connecting part 80 to provide interconnections between the GNP (conductor pattern 34U') and the first conductor pattern 36U'.

Pads $44U_1$ to $44U_N$ for mounting circuit element 100A are formed to be in contact with the first conductor pattern 36U'. In addition, pads $45U_1$ to $45U_N$ for mounting another circuit element 100B are formed to be in contact with the second conductive pattern 33L.

Here, the length of wiring pattern connecting the pads $44U_j$ (j=1 to N) with the pads $47L_j$ and the length of wiring pattern connecting the pads $45U_j$ with the pads $47L_j$ can be made respectively the same to implement equal length wiring.

As the material of the insulating layers 13 and 17U, epoxy resin, glass-fiber-reinforced epoxy resin (hereinafter also referred to as "glass epoxy" or "prepreg") obtained by impregnating epoxy resin into glass fiber, glass-fiber-reinforced polyimide resin obtained by impregnating polyimide resin into glass fiber, and the like can be used. In manufacturing the flexible printed wiring board of the present embodiment, glass epoxy is preferably used in terms of dimensional stability, mass productivity and thermal stability. Here, the insulating layers 13 and 17U may be formed of the same material selected from the above described materials, or may be formed with mutually different materials.

In addition, as for the insulating layers 20U and 22 forming coverlay layers, polyimide resin coated with epoxy-based adhesive and the like can be used. In consideration of flexibility, heat resistance, insulating properties, and corrosion resistance, polyimide resin is preferable.

As the material for the conductor patterns 33L, 34U', and 36U', conductive metal such as copper, aluminum, stainless steel and the like can be used. In particular, in consideration of workability, copper is preferably used.

Figure 4A:
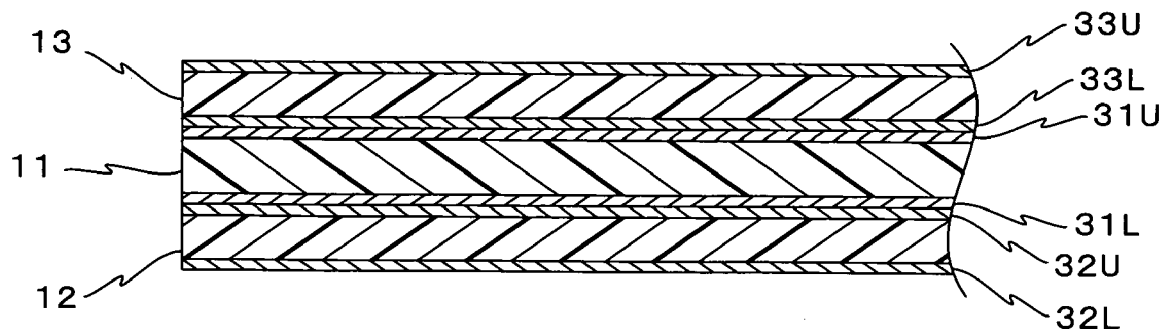
FIGS. 4A and 4B are cross-sectional views illustrating manufacturing steps of a flexible printed wiring board according to an embodiment of the present invention.

Next, manufacturing steps of the flexible printed wiring board 10 will be described. At first, a supporting member (hereinafter also referred to as "reinforcing layer") 11 shown in FIG. 4A is prepared. Here, as the supporting member 11, from the viewpoint of ease in handling during manufacturing steps, prepreg is preferably used. Specifically, GHPL830 (manufactured by Mitsubishi Gas Chemical Company, Inc.), E679 (manufactured by Hitachi Chemical Co., Ltd.), R1661 (manufactured by Matsushita Electric Works, Ltd.) and the like can be used. In terms of costs as well as dimensional stability, R1661 is preferable.

Next, a conductor film with a carrier (31L, 32U), an insulating layer 12, and a conductor foil 32L are prepared. The conductor film with a carrier (31L, 32U) is to be laminated on the surface in the −Z direction of the supporting member 11. The insulating layer 12 is to be laminated on the surface in the −Z direction of the conductor film with a carrier (31L, 32U). The conductor foil 32L is to be laminated on the surface in the −Z direction of the insulating layer 12. In addition, a conductor film with a carrier (31U, 33L), an insulating layer 13, and a conductor foil 33U are prepared. The conductor film with a carrier (31U, 33L) is to be laminated on the surface in the +Z direction of the supporting member 11. The insulating layer 13 is to be laminated on the surface in the +Z direction of the conductor film with a carrier (31U, 33L). The conductor foil 33U is to be laminated on the surface in the +Z direction of the insulating layer 13.

The above-mentioned conductor film with a carrier can be manufactured by pressing a conductor film (32U, 33L) to adhere onto the surface of a carrier member (31L, 31U). The conductor film (32U, 33L) is attached to the carrier member by an adhesive, such as an adhesive that contains benzotriazole or benzotriazole derivative. For example, VERZONE (SF-310, manufactured by DAIWA KASEI K. K.) and the like can be used so that the resulting film can be delaminated at a later time. In addition, commercially available products may be appropriately selected and used.

Such commercially available products allow subsequent delamination of a carrier member from the conductor film. The examples include Micro-thin (manufactured by Mitsui Mining and Smelting Co., Ltd.), XTR (manufactured by Olin Brass), and UTC-Foil (manufactured by METFOILS AB).

Prepreg is preferably used as the insulating layers 12 and 13. As commercially available products, prepreg with a thickness of about 25 μm to about 100 μm, such as GHPL830 (manufactured by Mitsubishi Gas Chemical Company, Inc.), E679 (manufactured by Hitachi Chemical Co., Ltd.), and R1661 (manufactured by Matsushita Electric Works, Ltd.) and the like can preferably be used in terms of the required thickness of the final product. In light of the thinning trend and improvement in crack resistance of flexible printed wiring boards, those with a thickness of about 25 μm to about 65 μm are more preferable.

Figure 5:
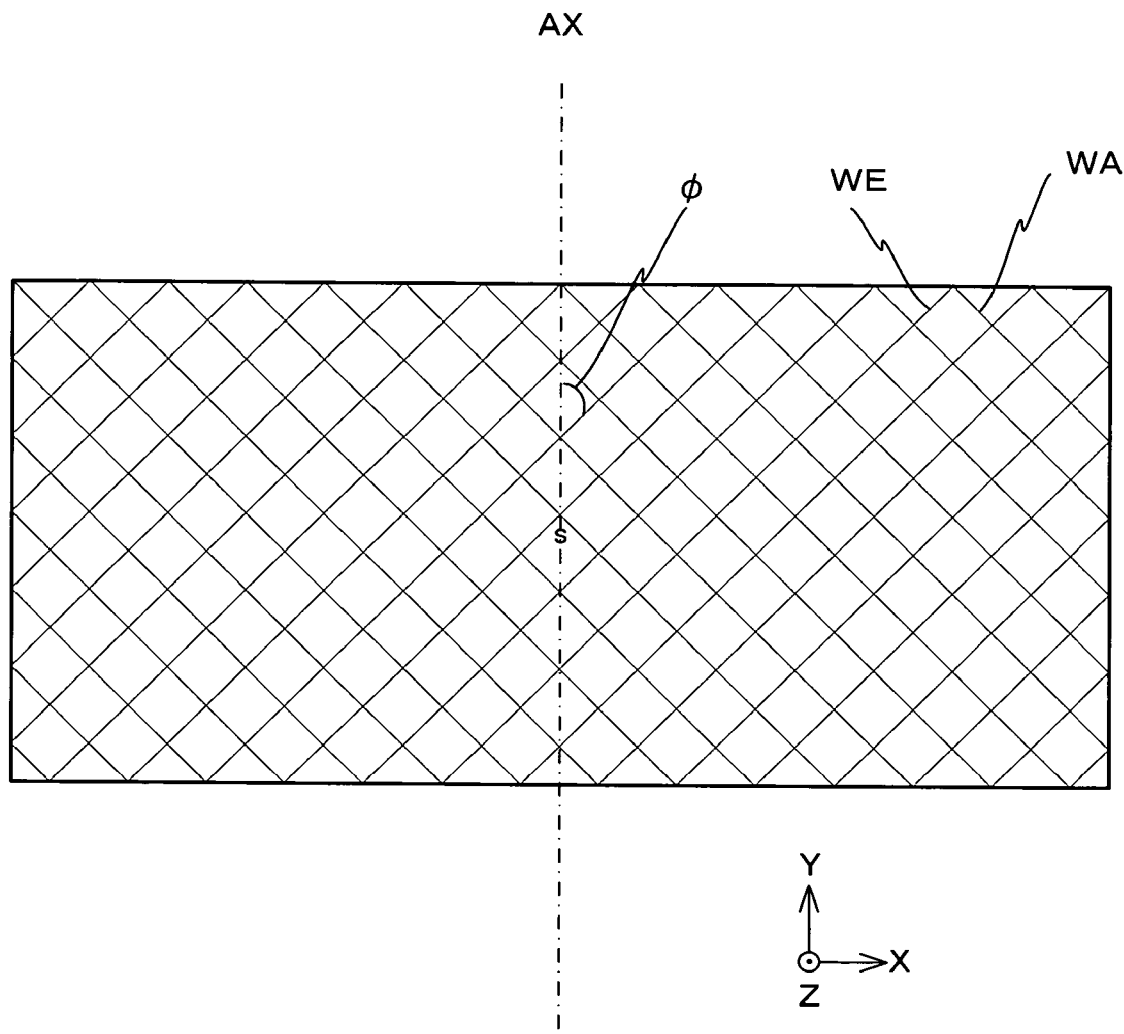
FIG. 5 is a schematic view for showing the directions of the warp and the weft of the fiber-reinforced fabric in an insulating layer of a flexible printed wiring board according to an embodiment of the present invention.

Here, as shown in FIG. 5, in the prepreg used as the insulating layers 12 and 13, the direction of the warp WA (and therefore the weft WE) of the prepreg is preferably arranged to obliquely intersects the direction of the bending axis AX (i.e., the Y direction).

The intersection angle φ is not particularly limited. However, from the viewpoint of improvement in crack resistance at the time of bending. The angle φ is preferably about 30° to about 60°. When the angle φ is about 45°, it provides the greatest prevention effect on crack occurrence in insulating layers.

Referring to FIG. 4A, the conductor film with a carrier (31L, 32U) is laminated on the reinforcing layer 11 so that the surface in the −Z direction of the reinforcing layer 11 and the surface in the +Z direction of the conductor film with a carrier (31L, 32U) are brought into contact. The insulating layer 12 is formed on the conductor film with a carrier (31L, 32U) so that the surface in the −Z direction of the conductor film with a carrier (31L, 32U) and the surface in the +Z direction of the insulating layer 12 are brought into contact.

The conductor film with a carrier (31U, 33L) is laminated on the reinforcing layer 11 so that the surface in the +Z direction of the reinforcing layer 11 and the surface in the −Z direction of the conductor film with a carrier (31U, 33L) are brought into contact. The insulating layer 13 is formed on the conductor film with a carrier (31U, 33L) so that the surface in the +Z direction of the conductor film with a carrier (31U, 33L) and the surface in the −Z direction of the insulating layer 13 are brought into contact.

The reinforcing layer 11 and the two insulating layers laminated as shown in FIG. 4A are pressed under predetermined conditions, for example, at about 185° C. under a pressure of about 40 kg/m² for about an hour, to produce a laminated body (FIG. 4A).

Subsequently, a $CO_2$ laser process is performed to form a via hole 41U. The opening 41U is formed so as to reach the surface in the +Z direction of the conductor layer 33L from the surface in the +Z direction of the insulating layer 13 (see FIG. 4B).

To form the opening 41U, first, a conductor layer 33U is formed on the insulating layer 13, and a region of the conductor layer 33U at which the via hole 41U will be formed on the surface in the +Z direction of the conductor layer 33U undergoes blackening. Subsequently, this region having undergone blackening is irradiated with a laser beam having a predetermined energy from the above to form the opening 41U.

Figure 4B:
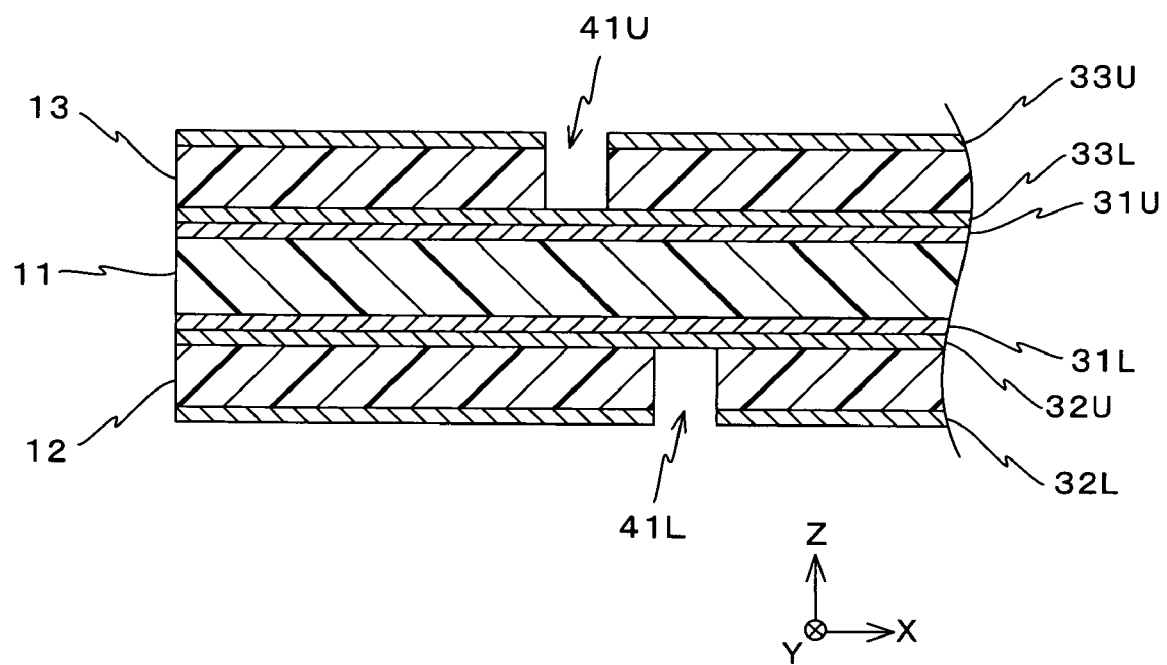

In forming a via hole 41L on the surface in the −Z direction of the insulating layer 12, the similar process is implemented (see FIG. 4B).

The conductor layers 33U and 32L are formed by pressing the conductor film 33U and the conductor film 32L to adhere onto the surface in the +Z direction of the insulating layer 13 and the surface in the −Z direction of the insulating layer 12, respectively.

Copper foil and the like may be used as the conductor films 33U and 32L. A conductor film with a carrier can be used to form a very thin layer of the conductor films 33U and 32L. In such a case, the conductor film with a carrier is first laminated on the corresponding insulating layer, and thereafter the carrier member is pealed off to leave the thin conductor film on the insulating layer.

Here, it is preferable to use a conductor film with a carrier having a conductor film thickness of about 3 μm to about 9 μm, such as Micro-Thin (manufactured by Mitsui Mining and Smelting Co., Ltd.), XTR (manufactured by Olin Brass), UTC-Foil (manufactured by METFOILS AB) or the like.

Figure 6A:
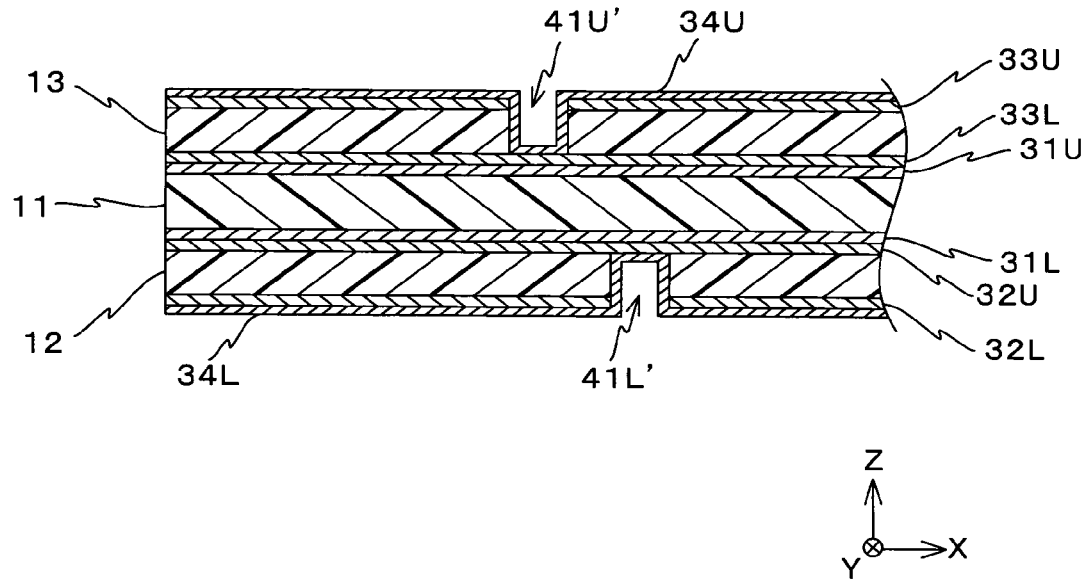
FIGS. 6A and 6B are cross-sectional views illustrating manufacturing steps of a flexible printed wiring board according to an embodiment of the present invention.

Referring to FIG. 6A, the remaining upper surface in the +Z direction of the conductor pattern 33U, the side surface of the opening 41U and the bottom surface of the opening 41U (that is, the exposed surface in the +Z direction of the conductor pattern 33L inside the opening 41U) undergo metal plating so that a plated opening is formed and a conductor film 34U is formed. Similarly, the remaining conductor pattern 32L, the side surface of the opening 41L, and the bottom surface of the opening 41L undergo metal plating so that a plated opening is formed and a conductor film 34L is formed.

The plating can be performed with a copper plating bath with a composition shown in Table 1 below.

TABLE 1

| Copper sulfate plating bath composition Plating bath | |
|---|---|
| Name of compound | Quantity (g/L) |
| Copper sulfate | 125 to 250 |
| Sulfuric acid | 30 to 100 |

Subsequently, referring to FIG. 6B, a resist layer is formed on the entire upper surface of the laminated body and is patterned by a known lithography process to form a resist pattern 16U, which covers the plated via hole 41U'. Similarly, a resist pattern 16L is formed on the lower surface in the −Z direction of the laminated body to cover the plated via hole 41L'.

As the resist layer, an acrylic dry film resist, such as HW440 (manufactured by Hitachi Chemical Co., Ltd.), for example, can be used. Moreover, NIT1025 (manufactured by Nippon Synthetic Chemical Industry Co., Ltd.), SA-50 (manufactured by DuPont) and the like can also be used.

Subsequently, by employing a tenting process using an etching solution including copper (II) chloride or the like, the solder delamination process using a metal resist, or the micro-etching process suitable for fine pattern forming or the like, etching is performed until the surface in the +Z direction of the insulating layer 13 and the surface in the −Z direction of the insulating layer 12 are exposed (see FIG. 7A).

As a result, a conductor pattern 34U' is formed on the surface in the +Z direction of the insulating layer 13. Also, a plated non-through via hole 41U' for electrically connecting the conductor pattern 34U' to the conductor layer 33L is formed. Likewise, on the surface in the −Z direction of the insulating layer 12, a conductor pattern 34L' is formed, and a plated non-through via hole 41L' for electrically connecting the conductor pattern 34L' to the conductor layer 32U is formed.

Next, an insulating layer 17U is formed on the surface in the +Z direction of the insulating layer 13, and an insulating layer 17L is formed on the surface in the −Z direction of the insulating layer 12. Here, the insulating layers 17U and 17L may be formed by lamination pressing through pin lamination. For these insulating layers 17U and 17L, a material similar to that used for the insulating layers 12 and 13 can be used. Subsequently, conductor layers 35U and 35L are formed on the surface in the +Z direction of the insulating layer 17U and on the surface in the −Z direction of the insulating layer 17L, respectively (see FIG. 7B).

The conductor layers 35U and 35L are formed by pressing the conductor film 35U and the conductor film 35L to adhere onto the surface in the +Z direction of the insulating layer 17U and the surface in the −Z direction of the insulating layer 17L, respectively.

Copper foil and the like can be used as the conductor films 35U and 35L. A conductor film with a carrier may be used to form a very thin layer of the conductor films 35U and 35L. In such a case, the conductor film with a carrier is laminated on the corresponding insulating layer, and thereafter the carrier member is pealed off to leave the thin conductor film on the insulating layer.

Here, it is preferable to use a conductor film with a carrier having a conductor film thickness of about 3 μm to about 9 μm, such as Micro-Thin (manufactured by Mitsui Mining and Smelting Co., Ltd.), XTR (manufactured by Olin Brass), UTC-Foil (manufactured by METFOILS AB) or the like.

Subsequently, using a process similar to the process for forming the above-described openings 41U and 41L, an opening 42U is formed on the insulating layer 17U and an opening 42L is formed on the insulating layer 17L (see FIG. 8A). Subsequently, using a plating process similar to the plating process described above, conductor films 36U and 36L are formed (see FIG. 8B). Thereafter in a manner similar to the manner described above, formation of a resist layer, and etching and removal of the resist layer are performed to form conductor pattern 36U' and 36L' (see FIG. 9).

Next, referring to FIG. 10, an ink is printed and hardened to form a coverlay layer 20U having openings 43U in a manner similar to the photolithography method. Likewise, the cover layer 20L having openings 43L is formed. Here, polyimide resin such as CKSE (manufactured by NIKKAN INDUSTRIES Co., Ltd.), for example, can be used to form the coverlay layers 20U and 20L. In the alternative, instead of an ink, a resist film may be laminated to form the coverlay layers.

Consequently, laminated bodies 10U and 10L are formed on the respective surfaces of the reinforcing layer 11 (see FIG. 10). Here, as shown in FIG. 10, the laminated body 10U includes the conductor layer 33L, the insulating layer 13, the insulating layer 17U and the coverlay layer 20U. The insulating layers 13 and 17U are respectively provided with via holes for inter-layer connection.

As shown in FIG. 10, the laminated body 10L includes the conductor layer 32U, the insulating layer 12, the insulating layer 17L and the coverlay layer 20L. The insulating layers 12 and 17L are respectively provided with via holes for inter-layer connection.

The following steps will be described with reference to the laminated body 10U. The laminated body 10L will be processed in the same or similar manner. The laminated body 10U formed on the surface in the +Z direction of the reinforcing layer 11 is separated from the reinforcing layer 11 at the interface between the carrier member 31U and the conductor layer 33L (see FIG. 11A).

Figure 11A:
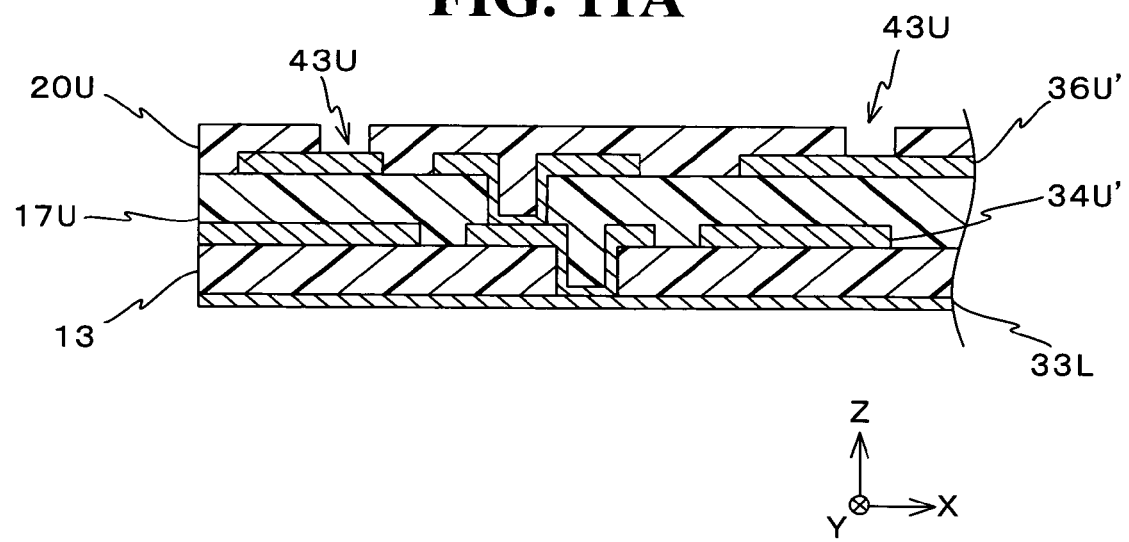
FIGS. 11A and 11B are cross-sectional views illustrating manufacturing steps of a flexible printed wiring board according to an embodiment of the present invention.
Figure 11B:
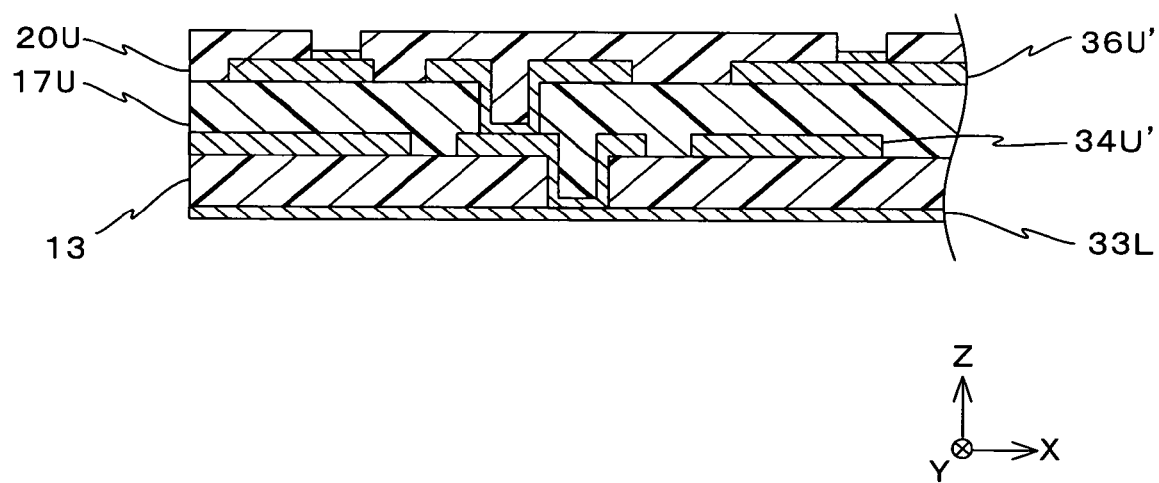

Subsequently, using the conductor layer 33L, which is formed on the surface in the −Z direction of the insulating layer 13, as a plating lead, nickel plating is carried out on portions of the upper surface of the laminated body 10U that are not covered by the coverlay layer 20U (FIG. 11B). Here, the nickel plating can be conducted with a plating bath shown in Table 2 under the following conditions: pH 4 to 5, liquid temperature of 40 to 60° C. and current density of approximately 2 to 6 A/dm².

TABLE 2

Nickel electrolytic plating bath composition
Plating bath

| Name of compound | Quantity (g/L) |
| --- | --- |
| Nickel sulfate | Approximately 300 |
| Nickel chloride | Approximately 50 |
| Boric acid | Approximately 40 |

Subsequently, gold plating can be performed on the portion that has undergone nickel plating using a plating bath with a composition shown in Table 3 under the following conditions: liquid temperature of 20 to 25° C. and current density of 0.2 to 1.0 A/dm². Here, in FIG. 11B, the two plated layers are illustrated as one layer.

TABLE 3

Au electrolytic plating bath composition
Plating bath

| Name of compound | Quantity (g/L) |
| --- | --- |
| Gold | 10 |
| Sodium cyanide | 30 to 35 |
| Ammonia | 50 to 60 |

Figure 12:
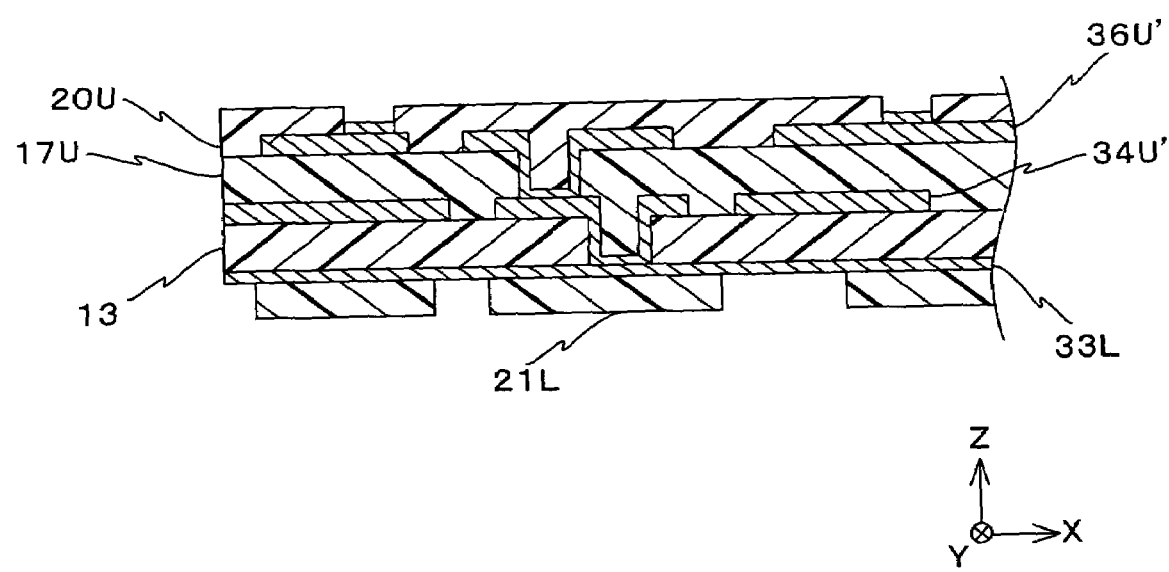
FIG. 12 is a cross-sectional view illustrating a manufacturing step of a flexible printed wiring board according to an embodiment of the present invention.

After completion of the above-described plating process, an ink is printed and hardened on the conductor layer 33L provided on the surface in the −Z direction of the laminated body 10U to form a resist layer 21L in a matter similar to the photolithography method (FIG. 12). Here, AUS series (manufactured by TAIYO INK MFG CO., LTD.) and DSR series (manufactured by TAMURA Corporation), for example, can be used to form the resist layer.

Here, the resist layer 21L can be formed only in the element mounting part where circuit elements will be mounted on the surface in the −Z direction of the conductor layer 33L. Alternatively, it may be formed on the entire surface except the bending part.

Figure 13A:
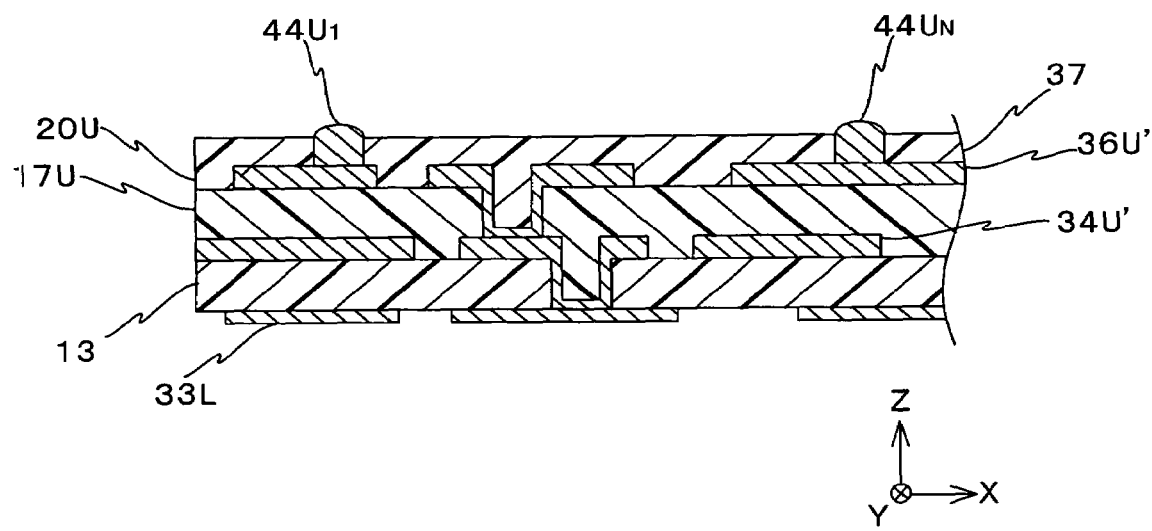
FIGS. 13A and 13B are cross-sectional views illustrating manufacturing steps of a flexible printed wiring board according to an embodiment of the present invention.

Subsequently, by disposing soldering paste onto the openings 43U by screen printing and subsequently performing a solder reflow process, or by using the solder ball direct mounting method or the like, pads $44U_1$ to $44U_N$ are formed (FIG. 13A).

Next, as shown in FIG. 13A, the uncovered portion of conductor layer 33L is etched to expose the surface in the −Z direction of the insulating layer 13. Then, the resist layer 21L is removed by making it come up using NaOH, thereby exposing the resulting conductor pattern 33L.

Figure 13B:
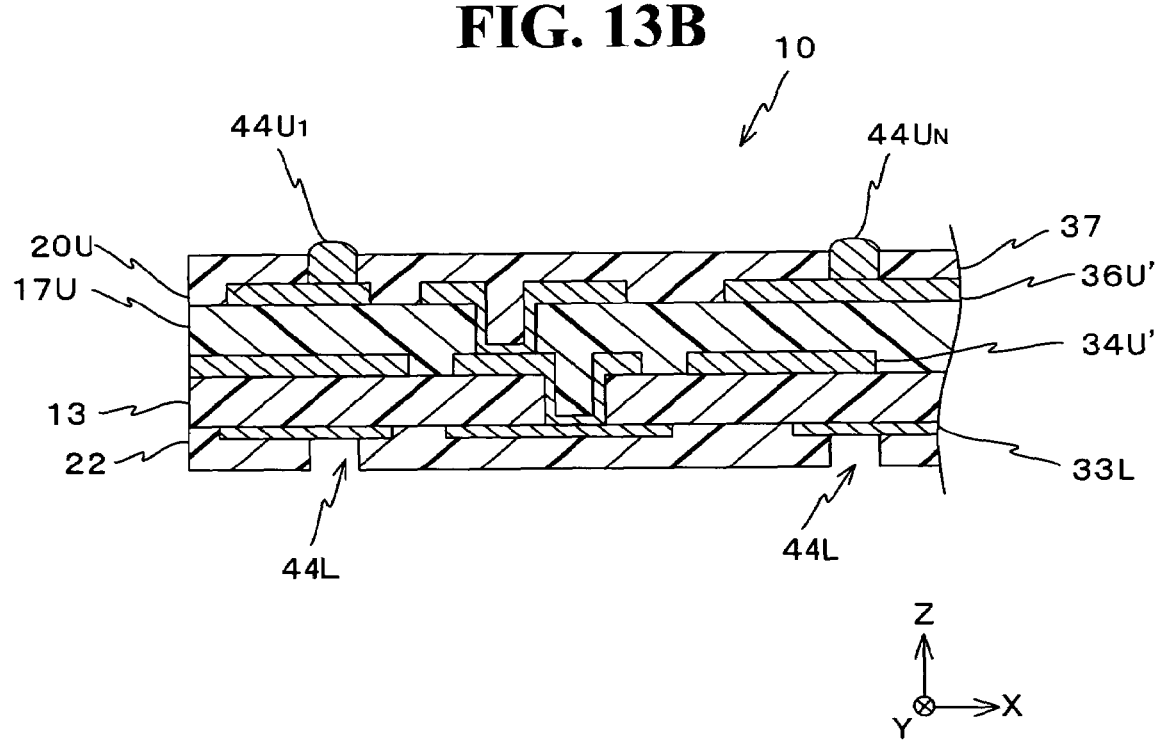

Subsequently, as shown in FIG. 13B, a coverlay layer 22 is formed so as to cover the surface in the −Z direction of the exposed insulating layer 13 and the conductor layer 33L, and openings 44L are formed in a manner similar to that used for forming the openings 43U.

Subsequently, by a process similar to the process described above, pads $45U_1$ and $45U_N$ are formed at the openings 44L, thereby completing a coreless thin type flexible printed wiring board 10.

The manufacturing process of the flexible printed wiring board 10 described above provides an excellent yield.

Moreover, in the above-described manufacturing method, the conductor layer 33L is used as the plating lead for plating, and this conductor layer 33L is processed after plating to form a conductor pattern. Therefore, the step of providing a plating lead and the step of pealing it off, which are required in the conventional art, is no longer required. This expedites the production of flexible printed wiring boards.

The laminated body 10L formed on the surface in the −Z direction of the reinforcing layer 11 undergoes the same process as the above-described process for the laminated body 10U so that a flexible printed wiring board having the same structure as the laminated body 10U is manufactured.

In the above described embodiment, the ground pattern included in the conductor pattern 34U' in the bending part 70 is formed as a solid pattern that substantially covers the entire area over which signal lines are formed. Alternatively, a power source pattern that imparts a ground potential in terms of alternating current may be formed in a similar solid pattern. In this case, signal lines by the outer layer conductor pattern 36U' can be formed to constitute a microstrip configuration in the bending part 70. Therefore, the characteristic impedance can be further stabilized.

Moreover, as for the metal plating used for the above-described manufacture of the flexible printed wiring board, nickel plating and subsequent gold plating were employed. However, a different combination of the same or different metal materials may be used in the plating.

Figure 14:
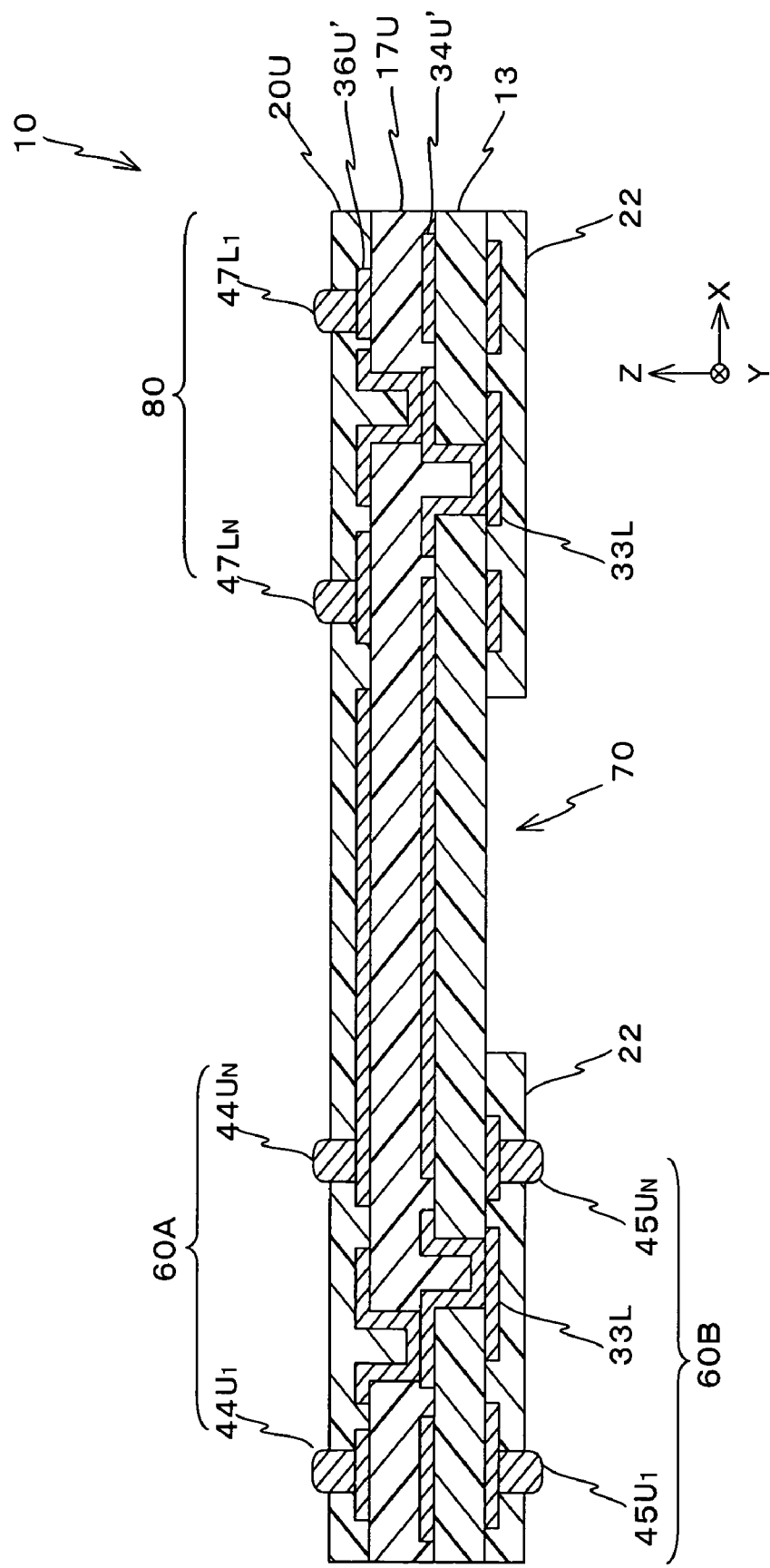
FIG. 14 is a sectional view showing a construction of a flexible printed wiring board according to an embodiment of the present invention.

Here, in the above described embodiment, the equal length wiring was realized by providing element mounting parts 60A and 60B on the left-hand side. Alternatively or in addition, as shown in FIG. 14, the other side (the right side) of the flexible printed wiring board 10 may be provided with the circuit pattern 33L and the coverlay layer 22 to implement equal length wiring.

The flexible printed wiring board of the present embodiment is useful as a thin type flexible printed wiring board. In particular, the flexible printed wiring board of the present embodiment has a stable in-line impedance when high-speed multi-pin logic LSIs and the like are mounted thereon and has excellent crack resistance.

Moreover, the method of manufacturing a flexible printed wiring board of the present embodiment is suitable for manufacturing a thin type flexible printed wiring board with an excellent yield.

The flexible printed wiring board 10 manufactured as described above is bent (folded over) along the bending axis AX after electronic circuit chips, such as the memory elements 100A and 100B, are mounted onto the element mounting parts 60A and 60B, respectively. Then, the surface in the –X direction of the memory element 100B is affixed to the surface in the –Z direction of the flexible printed wiring board 10 with an adhesive. Subsequently, as shown in FIG. 1B, the motherboard MB and the motherboard connecting part 80 are electrically connected so that the flexible printed wiring board with the circuit chips is mounted on electronic information apparatus.

Working examples of the present invention will now be described in detail. However, the present invention will not be limited by these examples in any ways.

Manufacture of Flexible Printed Circuit Boards in Working Examples 1 to 10

As the reinforcing layer 11, R1661 (manufactured by Matsushita Electric Works, Ltd.) was used. In forming the conductor film with a carrier (31L, 32U) to be laminated on the lower surface of the reinforcing layer 11, the conductor foils 32L and 33U to be laminated on the insulating layers 12 and 13, respectively, and the conductor film with a carrier (31U, 33L) to be laminated on the upper surface of the reinforcing layer 11, Micro-thin (manufactured by Mitsui Mining and Smelting Co., Ltd.) was used. For these conductor films with a carrier, XTR (manufactured by Olin Brass) or UTC-Foil (manufactured by METFOILS AB) may also be used in place of Micro-thin.

As the insulating layers 12 and 13, GHPL830 (manufactured by Mitsubishi Gas Chemical Company, Inc.) was used. Alternatively, E679 (manufactured by Hitachi Chemical Co., Ltd.) or R1661 (manufactured by Matsushita Electric Works, Ltd.) may also be used. The thickness of the prepreg ranged from about 25 μm to about 65 μm (as shown in Table 7 below).

The prepregs used as the insulating layers 12 and 13 were arranged so that the direction of the fabric of the warp WA (and therefore the weft WE) of the prepreg obliquely intersects a line extending in the Y direction to form an angle ranging from 30° to 60°, depending on Working Examples (see Table 7 below).

The reinforcing layer 11 and the insulating layers 12 and 13 were laminated as shown in FIG. 4A and were pressed under a pressure of about 40 kg/m$^2$ at about 185° C. for about one hour to form a laminated body.

Then the conductor layers 33U and 32L were formed. Subsequently, portions on the conductor layers 33U and 32L over the insulating layers 12 and 13 at which the non-through via holes 41L and 41U should be formed were blackened and irradiated with a $CO_2$ laser beam to form the openings 41U and 41L, respectively (FIG. 4B).

Next, the remaining surface of the conductor pattern 33U and the interior of the opening 41U as well as the remaining surface of the conductor pattern 32L and the interior of the opening 41L underwent metal plating with a plating bath using the composition shown in Table 4 below to form the conductor films 34U and 34L (FIG. 6A).

TABLE 4

| Copper Sulfate Plating Bath Composition Plating bath | |
|---|---|
| Name of compound | Quantity (g/L) |
| Copper sulfate | 125 to 250 |
| Sulfuric acid | 30 to 100 |

Figure 6B:
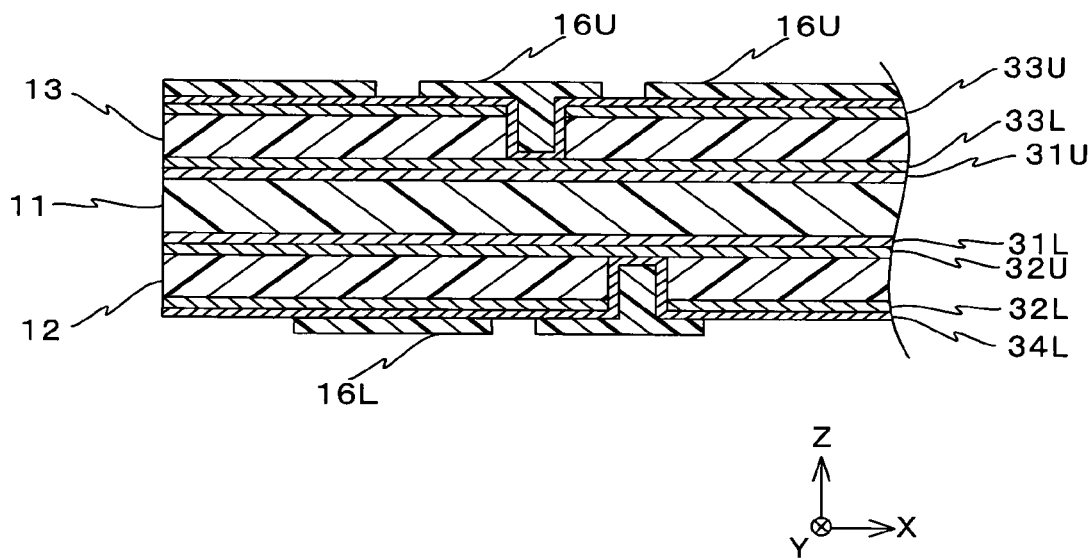

Subsequently, an acrylic dry film resist HW440 (manufactured by Hitachi Chemical Co., Ltd.) was laminated on the whole surface of conductor film 34U, and the resist is patterned by a known lithography method to form a resist pattern 16U defining regions where a conductor pattern should be formed (FIG. 6B).

In a similar fashion, a resist pattern 16L was formed on the surface of conductor film 34L to define regions where a conductor pattern should be formed (FIG. 6B).

Figure 7A:
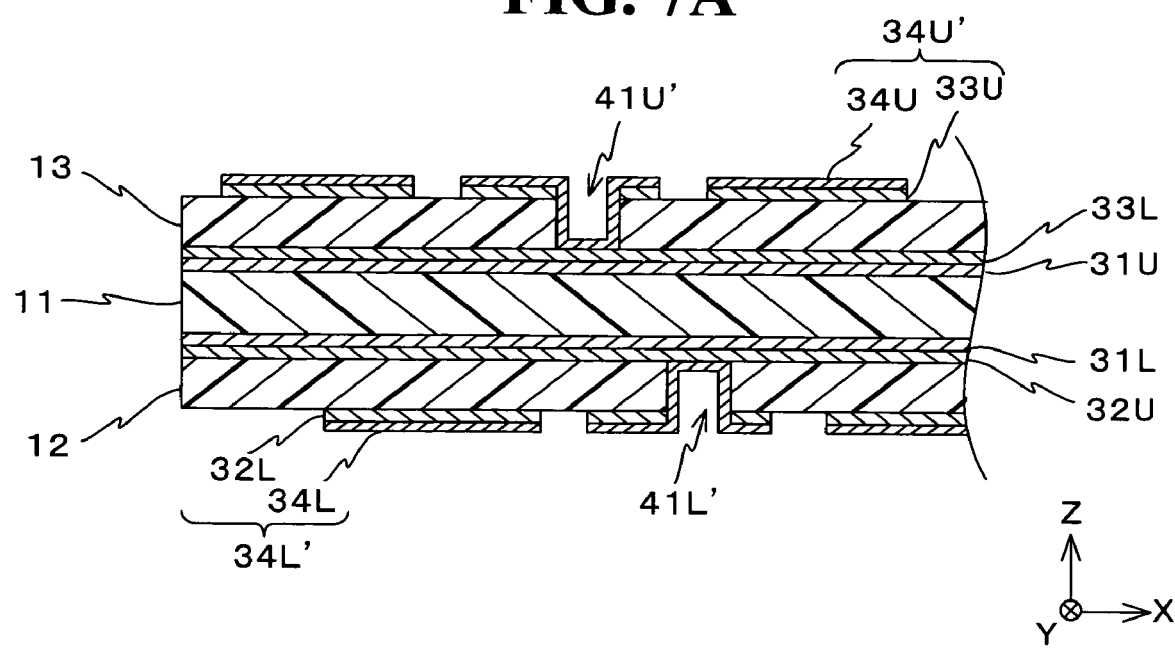
FIGS. 7A and 7B are cross-sectional views illustrating manufacturing steps of a flexible printed wiring board according to an embodiment of the present invention.

Subsequently, by employing a tenting process using copper (II) chloride, the solder delamination process using a metal resist, or the micro-etching process suitable for fine pattern forming, etching was performed until the surface in the +Z direction of the insulating layer 13 and the surface in the –Z direction of the insulating layer 12 were exposed (FIG. 7A).

Accordingly, a conductor pattern 34U' was formed on the surface in the +Z direction of the insulating layer 13, and a plated non-through via hole 41U' for electrically connecting the conductor pattern 34U' to the conductor layer 33L was formed. Likewise, on the surface in the –Z direction of the insulating layer 12, a conductor pattern 34L' was formed, and a plated non-through via hole 41L' for electrically connecting the conductor pattern 34L' to the conductor layer 32U was formed (FIG. 7A).

Figure 7B:
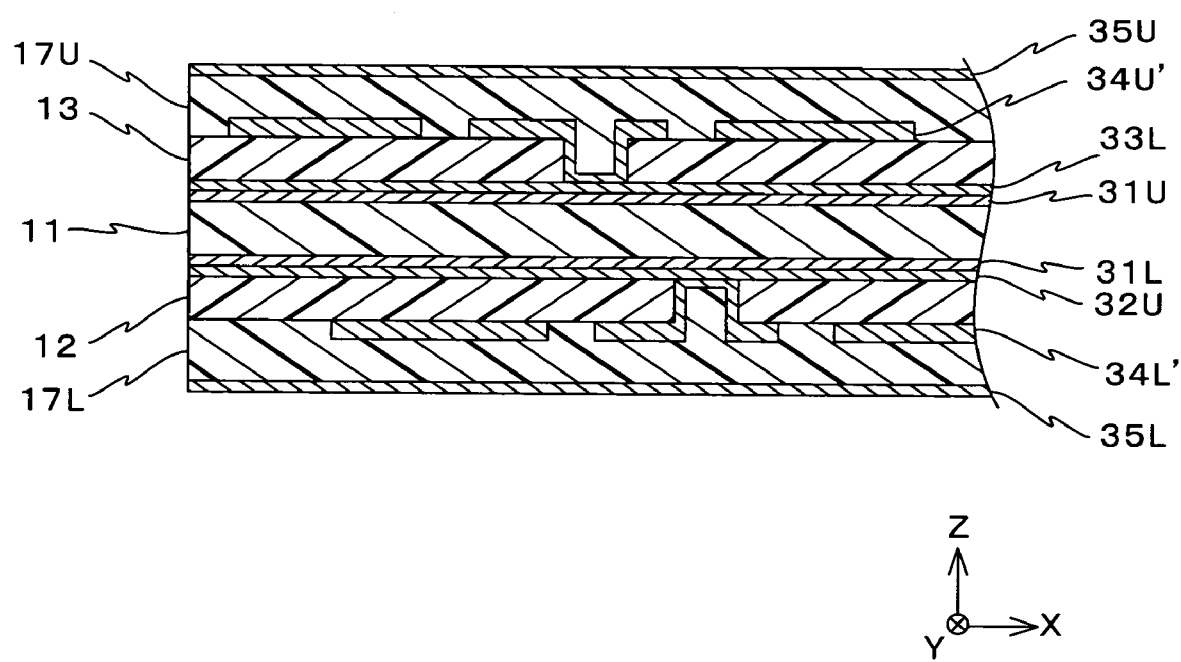

Next, by lamination pressing through pin lamination, an insulating layer 17U was formed on the surface in the +Z direction of the insulating layer 13, and an insulating layer 17L was formed on the surface in the –Z direction of the insulating layer 12 (FIG. 7B). Subsequently, by pressing Micro-Thin (with thickness of approximately 5 μm, manufactured by Mitsui Mining and Smelting Co., Ltd.) to adhere onto the surface in the +Z direction of the insulating layer 17U and onto the surface in the –Z direction of the insulating layer 17L, respectively, and by pealing off the carrier member, conductor layers 35U and 35L were formed (FIG. 7B).

Figure 9:
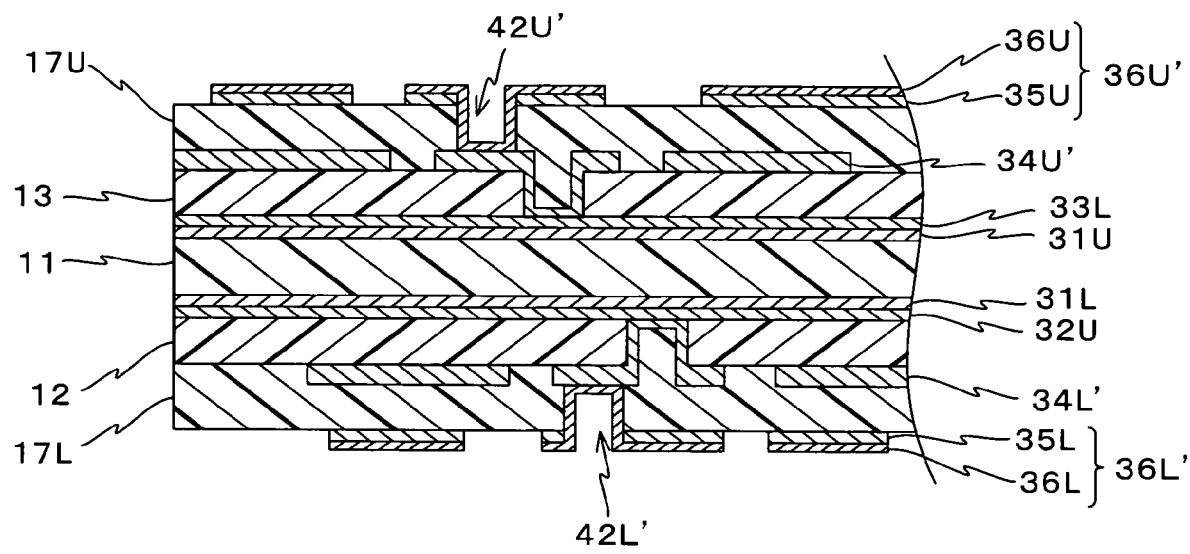
FIG. 9 is a cross-sectional view illustrating the manufacture of a flexible printed wiring board according to an embodiment of the present invention.

Subsequently, using a process similar to the process for forming the openings 41U and 41L, an opening 42U was formed in the insulating layer 17U and an opening 42L was formed in the insulating layer 17L (FIG. 8A). Subsequently, using a plating process that is the same as or similar to the above-described process for forming the conductor layers 34U and 34L, conductor films 36U and 36L were formed (FIG. 8B). Then, using a process that is the same as or similar to the above-described process for forming the conductor pattern 34U' and 34L', conductor patterns 36U' and 36L' were formed (FIG. 9).

Subsequently, an ink is printed and hardened to form a coverlay layer 20U having openings 43U in a manner similar to the photolithography method. Likewise, the cover layer 20L having openings 43L is formed on the opposite side. As a result, laminated bodies 10U and 10L were formed on the respective surfaces of the reinforcing layer 11 (FIG. 10).

As described above, the laminated body 10U formed on the surface in the +Z direction of the reinforcing layer 11 was separated from the reinforcing layer 11 at the interface between the carrier member 31U and the conductor layer 33L (FIG. 11A).

Subsequently, using the conductor layer 33L, which has been formed on the surface in the −Z direction of the insulating layer 13, as the plating lead, nickel plating was carried out on the whole surface of the portions that were not covered by the coverlay layer 20U using a plating bath with the composition shown in Table 5 under the following conditions: pH 4 to 5, liquid temperature of 40 to 60° C. and current density of approximately 2 to 6 A/dm$^2$.

TABLE 5

| Nickel Electrolytic Plating Bath Composition Plating bath | |
|---|---|
| Name of compound | Quantity (g/L) |
| Nickel sulfate | Approximately 300 |
| Nickel chloride | Approximately 50 |
| Boric acid | Approximately 40 |

Subsequently, gold plating was performed on the portions that have undergone nickel plating using a plating bath with the composition shown in Table 6 under the following conditions: liquid temperature of 20 to 25° C. and current density of 0.2 to 1.0 A/dm$^2$ (FIG. 11B).

TABLE 6

| Au Electrolytic Plating Bath Composition Plating bath | |
|---|---|
| Name of compound | Quantity (g/L) |
| Gold | 10 |
| Sodium cyanide | 30 to 35 |
| Ammonia | 50 to 60 |

After the completion of the above-described plating process, a resist layer 21L was formed on the conductor layer 33L provided on the surface in the −Z direction of the laminated body 10U using AUS series (manufactured by TAIYO INK MFG. CO., LTD.). In stead of AUS series, DSR series (manufactured by TAMURA Corporation) (FIG. 12) may be used.

Subsequently, by disposing a soldering paste onto the openings 43U by screen printing and by solder reflowing, pads $44U_1$ to $44U_N$ were formed. Instead of using screen printing, the solder ball direct formation method may be used to form the pads.

Next, etching was performed to expose the surface in the −Z direction of the insulating layer 13 and the resist layer 21L was removed by making it come up using NaOH of 20 to 40 g/L, thereby forming conductor pattern 33L (FIG. 13A).

Subsequently, a coverlay layer 22 was formed so as to cover the surface in the −Z direction of the exposed insulating layer 13 and the surface in the −Z direction of the conductor layer 33L, and openings 44L were formed in a manner similar to that used for forming the openings 43U (FIG. 13B).

Subsequently, in a manner similar to that used for forming pads $44U_1$ to $44U_N$, pads $45U_1$ and $45U_N$ were formed inside the openings 44L, thereby completing working examples of a coreless thin type flexible printed wiring board 10 according to the present invention. Working Examples 1-10 differ among themselves in terms of the following various manufacturing and dimensional parameters: the thickness of insulating layers 13 and 17L, the width of the conductor pattern 36U', the angle φ of the prepreg fiber of the insulating layers 13 and 17L (FIG. 5), and the angle φ of the conductor pattern 36U' in the bending part 70 (FIG. 3). These parameters are listed in Table 7.

Here, in Working Examples 1 to 10 and Reference Examples 1 to 4 (which will be described below), the coverlay layer 22 was formed only in the portion 60B where electronic circuit chips are mounted on the surface in the −Z direction of the conductor layer 33L (see FIG. 2).

Bending Test and Continuity Test

Bending tests and continuity tests were carried out for flexible printed wiring boards of Working Examples 1 to 10 with impedance of 50 Ω (design value), which were manufactured as described above. The MIT (flexural fatigue resistance) test of JIS5016 was adopted as the bending test, and occurrence of cracks in insulating layers and conductor layers were examined. In addition, the continuity test was conducted with a TCT (thermo cycle test) tester, and the continuity was examined after predetermined numbers of repetition of the thermal cycle consisting of raising the temperature from −55° C. to 125° C. in 30 minutes and lowering the temperature in the reverse manner. The continuity was evaluated at 50 cycles and 100 cycles. The lost continuity results were indicated as NG. The test results for Working Examples 1-10 are shown in Table 7.

Manufacture of Flexible Printed Circuit Boards of Comparative Examples 1 to 5

Comparative Examples 1 to 5 were manufactured and tested. In Comparative Examples 1 to 5, the conductor pattern 33L was formed in the bending part 70 as well. Thus, the number of conductor layers in the bending part 70 was three (3). Comparative Examples 1-4 differ among themselves in terms of the fiber directional angle φ of the prepreg in the insulating layer 17U and 13 and the bending angle θ of the conductor pattern 36U'. Otherwise, Comparative Examples were manufactured in the same way as in the manufacture of the flexible printed wiring boards of Working Examples 1 to 10. The above described bending tests as well as the continuity tests were conducted with respect to Comparable Examples 1-4. The results are shown in Table 8.

Manufacture of Flexible Printed Circuit Boards of Reference Examples 1 to 4

The flexible printed wiring boards of Reference Examples 1 and 2 were manufactured in the same way as in the manufacture of the flexible printed wiring boards of Working Examples 1 to 10 except that the angle φ of the warp and the weft of the glass fiber in the insulating layers 17L and 13 relative to the bending axis was set to 25° and 65°, respectively, and that the bending angle θ of the conductor pattern 36U' was set to 0°. These parameters and the results of the bending and continuity tests are listed in Table 8.

In addition, the flexible printed wiring boards of Reference Examples 3 and 4 were manufactured in the same way as in the manufacture of the flexible printed wiring boards of Working Examples 1 to 10 except that the thickness of the insulating layers 17L and 13 was set to 100 μm, the angle φ of the warp and the weft of the glass fiber in the insulating layers 17L and 13 relative to the bending axis was set to 45°, and that the bending angle θ of the conductor pattern 16U' was set to 0°. These parameters and the results of the bending and continuity tests are listed in Table 8.

time of bending. However, in the continuity test, the flexible printed wiring board of Reference Example 1 already lost electrical continuity at 50 cycles.

As described above, it was found that a decrease in the number of conductor layers in the bending part reduces occurrence of cracks at the time of bending. In addition, it was found that by angularly offsetting the direction of the glass fiber in insulating layers relative to the bending axis, it is possible to form a conductor pattern that can maintain continuity after 50 cycles.

For each of the Working Examples 1 to 10, cracks did not occur in the insulating layers in bending tests, and electrical continuity was maintained after 100 cycles in the continuity test. Thus, it was found that a decrease in the number of conductor layers in the bending part coupled with an angular configuration of either or both of the glass fiber in the insulating layers and the signal line conductor pattern further improves crack resistance.

As described above, thin-type flexible printed wiring boards of Working Examples 1 to 10 excelled in crack resistance.

TABLE 7

| Classification | Conductor layer counts | | Conductor layer | | Thickness of insulating layer (μm) | Angle of glass fiber (φ) | Bending angle of pattern (θ) | Impe-dance* | Status of crack occurrence at the time of bending | | Continuity test Number of cycles | |
|---|---|---|---|---|---|---|---|---|---|---|---|---|
| | Implementation surface | Bending part | Width (μm) | Thickness (μm) | | | | | Insulating layer | Conductor layer | 50 | 100 |
| Example 1 | 3 | 2 | 50 | 20 | 40 | 35 | 90 | 50 | None | None | OK | OK |
| Example 2 | 3 | 2 | 50 | 20 | 40 | 45 | 90 | 50 | None | None | OK | OK |
| Example 3 | 3 | 2 | 50 | 20 | 40 | 55 | 90 | 50 | None | None | OK | OK |
| Example 4 | 3 | 2 | 50 | 20 | 40 | 60 | 45 | 50 | None | None | OK | OK |
| Example 5 | 3 | 2 | 50 | 20 | 40 | 30 | 30 | 50 | None | None | OK | OK |
| Example 6 | 3 | 2 | 50 | 20 | 40 | 45 | 45 | 50 | None | None | OK | OK |
| Example 7 | 3 | 2 | 30 | 20 | 25 | 45 | 45 | 50 | None | None | OK | OK |
| Example 8 | 3 | 2 | 30 | 20 | 25 | 45 | 90 | 50 | None | None | OK | OK |
| Example 9 | 3 | 2 | 80 | 20 | 65 | 45 | 45 | 50 | None | None | OK | OK |
| Example 10 | 3 | 2 | 80 | 20 | 65 | 45 | 90 | 50 | None | None | OK | OK |

*Design value (Ω)

TABLE 8

| Classification | Conductor layer counts | | Conductor layer | | Insulating layer Thickness (μm) | Angle of glass fiber (φ) | Bending angle of pattern (θ) | Impe-dance* | Status of crack occurrence at the time of bending | | Continuity test Number of cycles | |
|---|---|---|---|---|---|---|---|---|---|---|---|---|
| | Implementation surface | Bending part | Width (μm) | Thickness (μm) | | | | | Insulating layer | Conductor layer | 50 | 100 |
| Comp. Ex. 1 | 3 | 3 | 50 | 20 | 40 | 0 | 0 | 50 | Occurred | Occurred | NG | — |
| Comp. Ex. 2 | 3 | 3 | 50 | 20 | 40 | 15 | 0 | 50 | Occurred | Occurred | NG | — |
| Comp. Ex. 3 | 3 | 3 | 50 | 20 | 40 | 45 | 0 | 50 | None | Occurred | NG | — |
| Comp. Ex. 4 | 3 | 3 | 50 | 20 | 40 | 15 | 45 | 50 | Occurred | Occurred | NG | — |
| Comp. Ex. 5 | 3 | 3 | 50 | 20 | 40 | 25 | 45 | 50 | Occurred | None | NG | — |
| Ref. Ex. 1 | 3 | 2 | 50 | 20 | 40 | 25 | 0 | 50 | None | None | NG | — |
| Ref. Ex. 2 | 3 | 2 | 50 | 20 | 40 | 65 | 0 | 50 | None | None | OK | NG |
| Ref. Ex. 3 | 3 | 2 | 120 | 20 | 100 | 45 | 0 | 50 | None | None | OK | NG |
| Ref. Ex. 4 | 3 | 2 | 120 | 20 | 100 | 45 | 0 | 50 | None | None | OK | NG |

*Design value (Ω)

As shown in Table 8, as for the flexible printed wiring boards of Comparative Examples 1 to 5, occurrence of crack was observed in bending tests. Also in continuity tests, electrical continuity was already lost at 50 cycles.

In any of flexible printed wiring boards of Reference Examples 1 to 4, occurrence of crack was not observed at the The flexible printed wiring board of the present invention is useful as a thin-type flexible printed wiring board and is particularly suitable for miniaturizing high-speed and large-capacity memories and the like.

Moreover, the method of manufacturing the flexible printed wiring board of the present invention is suitable for manufacturing thin-type flexible printed wiring boards that have superior crack resistance and has an excellent yield.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A flexible printed wiring board having three parts including an element mounting part, a folding part, and a board mounting part, which are laterally disposed in that order, the element mounting part being configured to mount circuit elements on both top and bottom surfaces of the wiring board, the board mounting part being configured such that the top surface of the board mounting part can be mounted on an external circuit board, the flexible printed wiring board being configured to be folded over at the folding part around a virtual folding line that extends substantially in parallel with the wiring board such that the top surface of the wiring board faces an exterior when the flexible printed wiring board is bent, the flexible printed wiring board comprising:

a bottom conductor pattern in the element mounting part, the bottom conductor pattern being configured to mount a first circuit element on the bottom surface of the wiring board through a first plurality of pads that are directly in contact with the bottom conductor pattern, the bottom conductor pattern being absent in the folding part:

a lower insulating layer on the bottom conductor pattern in all of said three parts, the lower insulating layer having a first plurality of via holes in the element mounting part: a middle conductor pattern on the lower insulating layer in all of said three parts, portions of the middle conductor pattern being electrically in contact with portions of the bottom conductor pattern via said first plurality of via holes:

an upper insulating layer on the middle conductor pattern in all of said three parts, the upper insulating layer having a second plurality of via holes in the element mounting part; and a top conductor pattern on the upper insulating layer in all of said three parts, the top conductor pattern in the element mounting part being configured to mount a second circuit element on the top surface of the wiring board through a second plurality of pads that are directly in contact with the top conductor pattern, the top conductor pattern in the board mounting part being configured to mount the flexible printed wiring board to an external circuit board through a plurality of pads that are directly in contact with the top conductor pattern, portions of the top conductor pattern being electrically in contact with portions of the middle conductor pattern via said second plurality of via holes, wherein the top conductor pattern includes a plurality of signal lines in the folding part that extends in parallel with each other in a direction that forms an angle of about 30° to about 90° with respect to the direction of the virtual folding line, wherein the middle conductor pattern includes a ground pattern configured to impart a ground potential, and the ground pattern has a solid pattern that covers substantially an entire area over which said plurality of signal lines are disposed in the folding part, wherein the upper and lower insulating layers are made of a fiber-reinforced resin having warps and wefts, and each have a thickness of about 25 µm to about 65 µm, and the warps or the wefts of said fiber-reinforced plastic extend in a direction that forms an angle of about 0° to about 60° with respect to the direction of the virtual folding line.

2. The flexible printed wiring board according to claim 1, wherein the top conductor pattern including a plurality of signal lines in the folding part, and wherein the middle conductor pattern includes a ground pattern configured to impart a ground potential, and the ground pattern has a solid pattern that covers substantially an entire area over which said plurality of signal lines are disposed in the folding part.

3. The flexible printed wiring board according to claim 2, wherein said plurality of signal lines of the top conductor pattern extends in parallel with each other in a direction that forms an angle of about 30 degree to about 90 degree with respect to the direction of the virtual folding line.

4. The flexible printed wiring board according to claim 1, wherein the upper and lower insulating layers are made of a fiber-reinforced resin.

5. The flexible printed wiring board according to claim 4, wherein said fiber-reinforced resin includes warps and wefts of fiber, and the warps or the wefts of said fiber-reinforced resin extend in a direction that forms an angle of about 0 degree to about 60 degree with respect to the direction of the virtual folding line.

6. The flexible printed wiring board according to claim 1, wherein the thickness of each of the upper and lower insulating layers is about 25 µm to about 65 µm.

7. The flexible printed wiring board according to claim 1, further comprising a first coverlay layer covering the bottom conductor pattern in the element mounting part, wherein the coverlay layer is absent in the folding part.

8. The flexible printed wiring board according to claim 7, further comprising a second coverlay layer covering the top conductor pattern in all of said three parts.

9. The flexible printed wiring board according to claim 1, wherein the bottom conductor pattern is further disposed under the lower insulating layer in the board mounting part, wherein the lower insulating layer has a third plurality of via holes in the board mounting part, and portions of the middle conductor pattern are electrically in contact with portions of the bottom conductor pattern in the board mounting part via said third plurality of via holes, wherein the upper insulating layer has a fourth plurality of via holes in the board mounting part, and portion of the top conductor pattern are electrically in contact with portions of the middle conductor pattern via said fourth plurality of via holes.

10. The flexible printed wiring board according to claim 1, wherein each of the first and second pluralities of pads has a multi-layered structure.

* * * * *